United States Patent
Pawate et al.

(10) Patent No.: US 6,185,704 B1
(45) Date of Patent: Feb. 6, 2001

(54) SYSTEM SIGNALING SCHEMES FOR PROCESSOR AND MEMORY MODULE

(75) Inventors: Basavaraj I. Pawate, Ibaraki (JP); Matthew A. Woolsey, Princeton, TX (US); Douglas L. Mahlum, Allen, TX (US); Fred J. Reuter, Plano, TX (US); Yoshihide Iwata, Ibaraki-ken (JP); Judd E. Heape, Dallas, TX (US)

(73) Assignee: Texas Instruments Incorporated, Dallas, TX (US)

(*) Notice: Under 35 U.S.C. 154(b), the term of this patent shall be extended for 0 days.

(21) Appl. No.: 09/058,000

(22) Filed: Apr. 9, 1998

Related U.S. Application Data

(60) Provisional application No. 60/043,663, filed on Apr. 11, 1997, and provisional application No. 60/049,956, filed on Jun. 17, 1997.

(51) Int. Cl.$^7$ ................................................. G11C 29/00
(52) U.S. Cl. ................................................. 714/719
(58) Field of Search ................................... 714/719, 718, 714/5; 711/104

(56) References Cited

U.S. PATENT DOCUMENTS

| | | |
|---|---|---|
| 5,043,984 * | 8/1991 | Tomisawa et al. ............... 714/27 |
| 5,500,828 | 3/1996 | Doddington et al. . |
| 5,528,549 | 6/1996 | Doddington et al. . |
| 5,638,530 | 6/1997 | Pawate et al. . |
| 5,678,021 | 10/1997 | Pawate et al. . |

* cited by examiner

Primary Examiner—Phung M. Chung
(74) Attorney, Agent, or Firm—Robert L. Troike; Frederick J. Telecky, Jr.

(57) ABSTRACT

A computer system includes a main processing unit (12) coupled to a DSP/memory module (40). The DSP/memory module (40) includes semiconductor memory (42) and digital signal processor circuitry (44) including one or more digital signal processors (56). The DSP/memory module (40) may be placed in standard main memory sockets, such as a SIMM or DIMM sockets, and used as conventional main memory. The memory module can also be used in a smart mode, wherein the digital signal processor (56) performs operations on data for retrieval by the main processing unit (12).

42 Claims, 17 Drawing Sheets

| 15 | 14-13 | 12 |
|---|---|---|
| MODCTL | LM_SPACE_SELECT | IREQSERV |

| 11 | 10-9 | 8 |
|---|---|---|
| MAXOD | LM_ADR_CTRL | MANUAL HOLD |

| 7 | 6 | 5 | 4 |
|---|---|---|---|
| DEVBUSYINTEN | LM_RW_FLAG | RXINTEN | TXINTEN |

| 3 | 2 | 1 | 0 |
|---|---|---|---|
| DSP MP/-MC | DSP CLKMD1 | SHARED_MEM_INUSE | DSP RESET |

DSP CONTROL REGISTER BIT DEFINITIONS

*FIG. 4a*

| 15-12 |
|---|
| RESERVED |

| 11 | 10-9 | 8 |
|---|---|---|
| PDH | RESERVED | DSP-HOLDA |

| 7 | 6 | 5 | 4 |
|---|---|---|---|
| DEVBUSY INT | LM_DATA_RDY | RXEMPTY | TXFULL |

| 3 | 2 | 1 | 0 |
|---|---|---|---|
| RESERVED | DSP CLKMD1 | RESERVED | RESERVED |

DSP STATUS REGISTER BIT DEFINITIONS

*FIG. 4b*

| 15-2 | 1 | 0 |
|---|---|---|
| RESERVED | RXFULL | TXEMPTY |

PCSR DEFINITION

*FIG. 4c*

| 15-12 |
|---|
| RESERVED |

| 11-8 |
|---|
| RESERVED |

| 7 | 6 | 5-4 |
|---|---|---|
| RESERVED | DSPRXDINTEN | RESERVED |

| 3 | 2 | 1-0 |
|---|---|---|
| PDH | DSPTXDINTEN | CLK DIVIDER 1-0 |

DSP SYSTEM CONFIGURATION REGISTER BIT DEFINITIONS

*FIG. 4d*

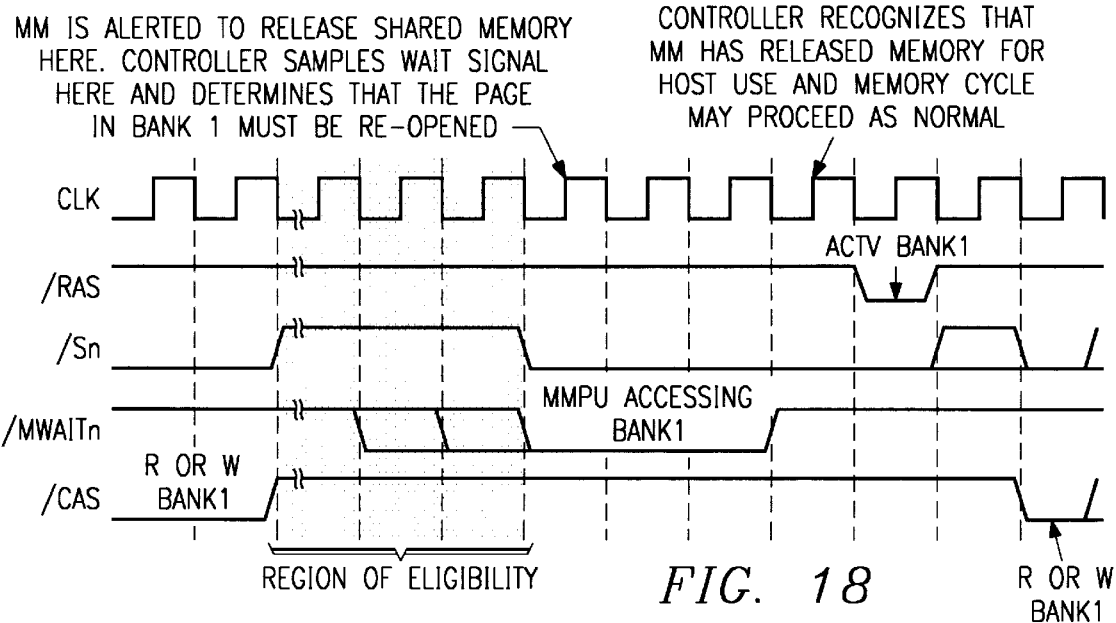
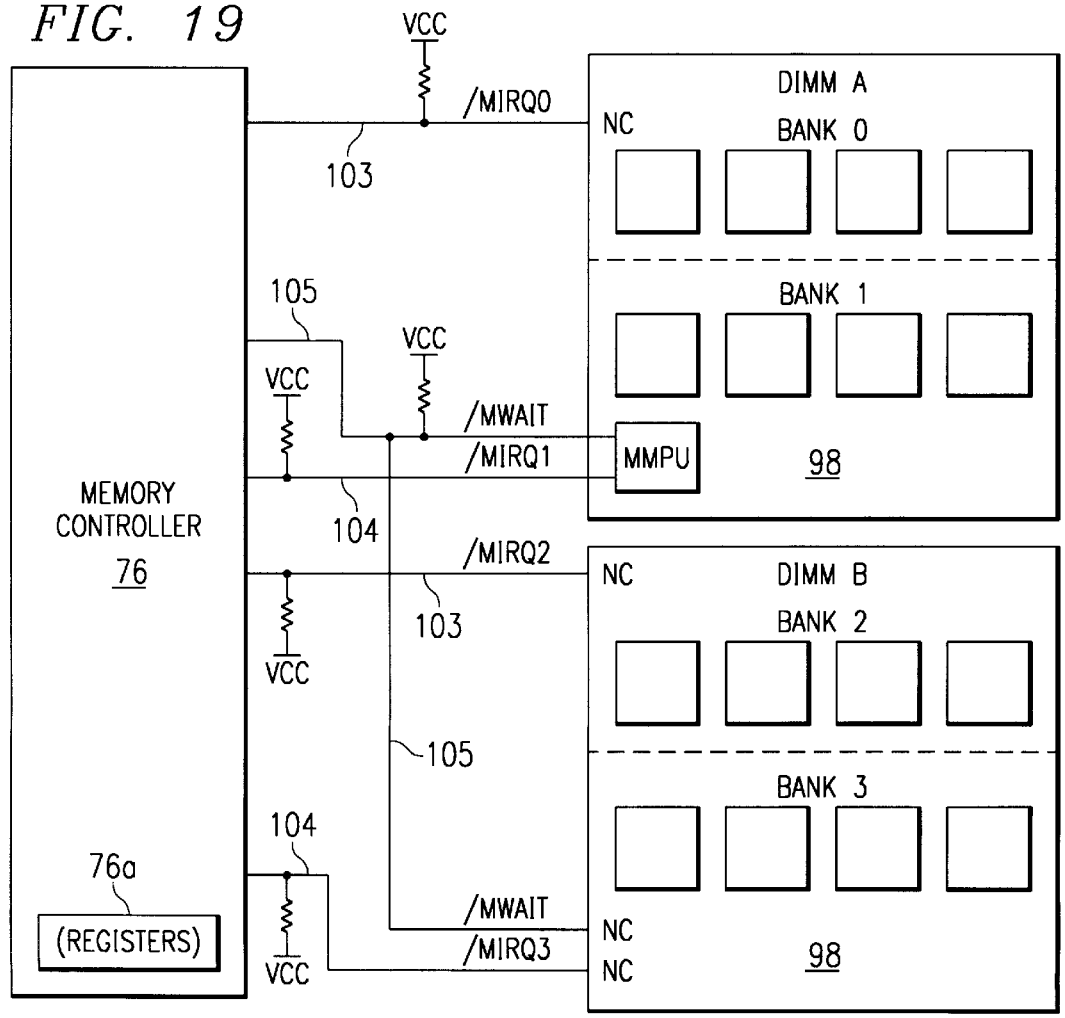

SYSTEM SIGNALING SCHEMES FOR PROCESSOR AND MEMORY MODULE

This application claims priority under 35 USC §119(e)(1) of Pawate et al. "Processor and Memory Module", provisional application Ser. No. 60/043,663, filed on Apr. 11, 1997 and Heape et al. "System Signaling Schemes for Processor and Memory Module", provisional application Ser. No. 60/049,956, filed on Jun. 17, 1997.

BACKGROUND OF THE INVENTION

1. Technical Field

This invention relates in general to computers and, more particularly, to computer memory modules.

2. Description of the Related Art

Over the last few years, the operation of the personal computer has become more oriented toward multimedia operation. Multimedia computers typically include a mass storage device with a replaceable medium, such as a CD-ROM (compact disk read only memory) or a DVD (digital versatile disk), a sound card with a FM synthesis or wave table generation processor, real-time video capabilities and three dimensional graphics. Other multimedia capabilities, such as speech synthesis and voice recognition, are becoming more mainstream as the power of the computers increase.

Multimedia capabilities such as sound, video, fax, modem, compression and decompression, however, are resource intensive. Some features are bandwidth limited, meaning that the features cannot be expanded without increasing the bandwidth of the system buses. In a typical IBM-compatible PC, the ISA (industry standard architecture) bus runs at eight megahertz (16 bits) while the PCI (Peripheral Connect Interface) bus runs at thirty-three megahertz (32 bits). Other features are processor limited. In a multitasking computer system, the main processor can be responsible for a number of activities. Therefore, multimedia features which require a large number of processor instruction cycles can slow down the system or not execute properly. Still other multimedia features are memory limited. These features require a large amount of memory in order to execute. Large memories lead to increased system cost.

For example, modem features like V.34bis are primarily processor limited. Wavetable synthesis requires large amounts of memory and is memory-limited. Decompression feature like MPEG2 is compute-limited as well as bandwidth limited. With increasing clock-speeds of Intel CPUs, some of these can be executed on the host CPU. But this loads the host CPU with fewer MIPS (million instructions per second) available for the user application. Increased clock speeds also lead to increased power consumption and reduced battery life.

One popular approach is to provide these functions in a desktop computer using multiple add-in ISA or local bus cards. These add-in cards are host dependent and cannot be used on multiple platforms. For example, an ISA card cannot work on a Sun workstation or a Macintosh. Notebook computers, palmtops and PDAs (personal digital assistants) have no space for such ISA cards. And they all suffer from the classic Von Neumann bottleneck—the CPU-Memory bandwidth limitation.

Processor technology has focused on improving raw processing speed. As an example, the instruction cycle time of a recent digital signal processor design in the TMS320 family, by Texas Instruments Incorporated of Dallas, Texas, is 5 ns (nanoseconds), as compared to the cycle time of 200 ns in the first generation. As long as the computations are on-chip, these devices provide adequate throughput. But several applications in speech, signal and image processing are memory intensive and the gain in raw processing speed is lost when the processor has to fetch and process data from slower off-chip memories. The combined effect of decreasing cycle time of processors and increasing density of memory devices is further aggravating the CPU-to-memory bandwidth—a paramount issue in computer system design.

As computers evolve from desktop size to laptop, notebook and palmtop sizes, form factor and power consumption become critical. Laptops are expected to have the capability of a desktop as users demand more functionality.

Multiprocessing promises great potential for increasing the throughput of systems as the limits of decreasing the cycle time of uniprocessor systems are approached. But multiprocessing has not yet proliferated, primarily because of the "processor-driven" approaches and the difficulty in designing systems, developing communication protocols, and designing software support routines. Application partitioning is a major problem because it requires a detailed understanding of the application that is being accelerated. Software development methodologies and partitioning tools are still in their infancy. In addition, there is no standard way of connecting two or more processors.

Accordingly, a need has arisen for a method and apparatus for providing flexible, compatible processing for multimedia and other resource intensive features.

BRIEF SUMMARY OF THE INVENTION

In accordance with one embodiment of the present invention, the present invention provides a memory module comprising a semiconductor memory and one or more processors coupled to the semiconductor memory on an integrated module. Circuitry on the integrated module provides communications between system processing circuitry and the processor, such that said system processing circuitry can access the semiconductor memory as main memory and can instruct the processor to transform data and store transformed data in said semiconductor memory for access by the system processing circuitry.

The invention provides significant advantages over the prior art. Adding a digital signal processor to a computer system to enable enhanced functions is as easy as expanding the memory of a MPU (main processing unit). The memory module can use a form factor of the type standardized by organizations like IEEE, JEDEC, and so on, such as a SIMM (single in-line memory module) or DIMM (dual in-line memory module) form factor.

Different applications may be downloaded by the MPU to the memory module for local execution. The memory module therefore supports multiple functionality, i.e., downloadable, multiple functions under software control of the MPU.

The DSP/memory module offers the highest possible bandwidth between the MPU and coprocessor at any given time and technology. The DSP/memory module is both bus-independent, and host-independent, for use with PCs (personal computers), PDAs (personal digital assistants), workstations and other computer systems.

The DSP/memory module reduces system cost by sharing system memory over a number of multimedia functions.

The module provides a framework for easily scaling up the processing power of a computer system; an existing single processor system can be transformed into a scaleable, multiprocessing system simply by adding a memory module Users do not have to change their product platforms in order to get/offer new, value-added functions. Adding the DSP/memory module and software can allow users to increase the capability of their computers.

In accordance with other embodiments of the present invention, implementation of the memory module with the interrupt request, IREQ, and WAIT signals are described further in this application. Six options are presented in accordance with other embodiments describing how to implement these signals (including their timing and relation to the host memory controller).

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIGS. 4a, 4b, 4c and 4d illustrate definitions of control words used to control the operation of the DSP/memory module;

FIG. 18 illustrates the timing for the WAIT signal for DDR-S/S DRAM, eligibility option 3, as discussed in "IMPLEMENTATION OF IREQ AND WAIT SIGNALS: OPTION 1";

FIG. 19 illustrates the memory module(s) to host controller block diagram as discussed in "IMPLEMENTATION OF IREQ AND WAIT SIGNALS: OPTION 2";

DETAILED DESCRIPTION OF THE INVENTION

The present invention is best understood in relation to FIGS. 1–12 of the drawings, like numerals being used for like elements of the various drawings.

Figure 1:
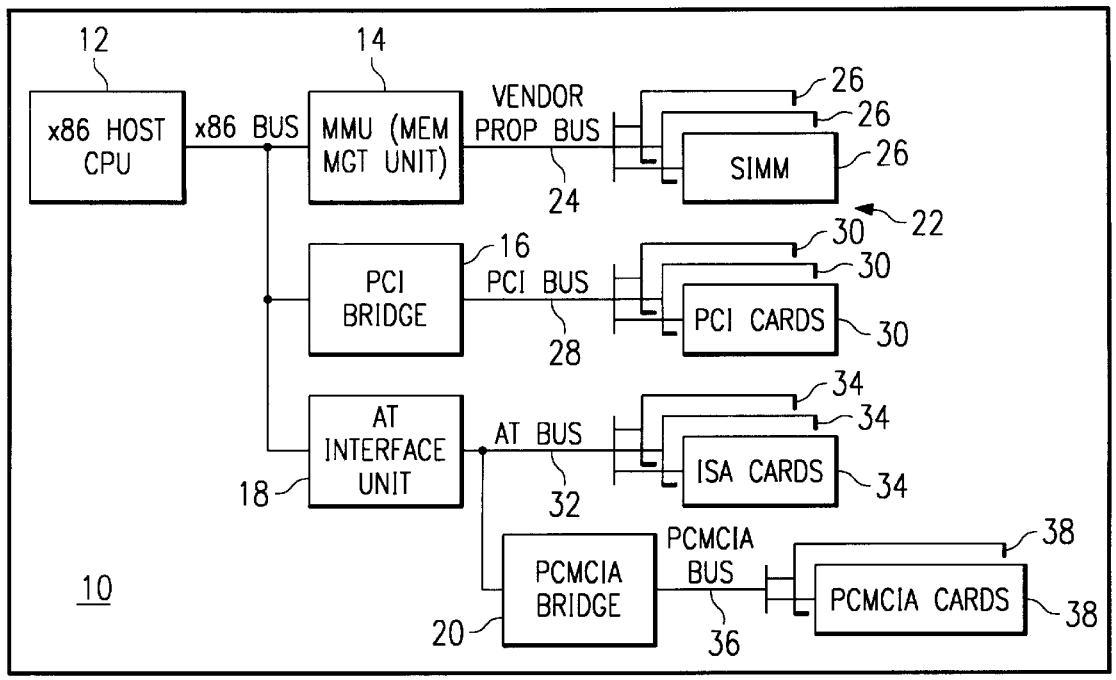
FIG. 1 illustrates a prior art computer architecture.

FIG. 1 illustrates a prior art computer system 10. A main processor (hereinafter MPU) 12 communicates with other electronic devices over one or more paths. In FIG. 1, the MPU 12 is coupled to a memory management unit (MMU) 14, a PCI bridge 16, an AT interface unit 18 and a PCMCIA (Personal Computer Memory Card International Association) bridge 20. The MMU 14 couples the MPU 12 to main memory 22 via a memory bus 24, which is typically a vendor specified bus. The main memory 22 is typically formed of a plurality of memory modules 26 packaged in a standard form factor. The most popular form factor is currently the SIMM module, although DIMM modules are gaining in popularity.

The PCI Bridge 16 couples the MPU 12 to a PCI local bus 28. The PCI local bus provides slots for one or more peripheral cards 30. Because the PCI bus is faster than the AT bus, it is generally used for higher speed peripherals such as the video/graphics card.

The AT interface unit 18 couples the MPU 12 with the AT bus 32 (also known as the ISA—industry standard architecture—bus). The AT bus 32 can receive one or more peripheral cards 34. The PCMCIA bridge 20 is coupled to the AT interface unit and provides a PCMCIA bus 36 to support externally replaceable peripherals 38 (also known under the name "PC Cards") which are commonly used in notebook computers.

A card having one or more processors can be added to an existing PC platform via the ISA bus 32 or, more recently, the PCI bus 28. The ISA bus 32 was developed several years ago and many popular peripheral cards subscribe to this standard. However, the bandwidth between the MPU and a processor on a ISA card is limited to 8MHz*16 bits per second. There are several sound applications today that cannot run due to this bandwidth limitation. Later, the PCI bus was proposed as a standard bus; its bandwidth is limited to 33 MHz*32 bits per second. In either case, the technology has developed faster than the bus technology.

In order to reduce bus traffic somewhat, MMX technology is currently available. While MMX technology allows the MPU to perform some multimedia functions through an enhanced instruction set, it has significant disadvantages. Data must be moved from main memory to the MPU 12 for processing. This results in significant bus traffic, loads the MPU 12 and demands faster and faster processor speeds. For example, it is estimated that MPEG2 video and audio decoding in real-time at a rate of thirty frames per second requires a 225 MHz Pentium processor. In order to provide the MMX instructions, the MPU 12 must switch between floating point mode and fixed point mode. There is a significant overhead in switching between modes and switching can be frequent in multitasking systems where both floating point applications (such as a spreadsheet) and fixed point applications are being used.

Figure 2:
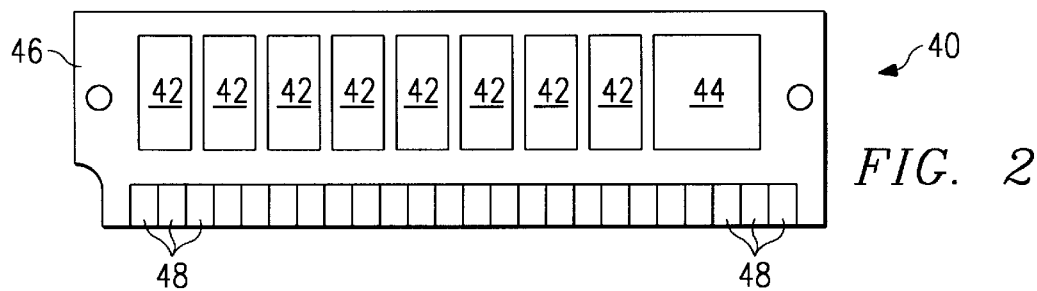
FIG. 2 illustrates a DSP/memory module.

FIG. 2 illustrates a DSP/memory module which provides a solution to many of the problems associated with the architecture shown in FIG. 1, using a concept referred to herein as "Basava" technology. The DSP/memory module 40 includes one or more memory circuits 42 and DSP circuitry 44 disposed on a substrate 46. A plurality of contacts 48 are formed on substrate 46 to electrically connect the DSP/memory module 40 to the system board which houses the MPU 12. In the preferred embodiment, the DSP/memory module 40 is inserted into a standard memory slot, such as a SIMM slot or a DIMM slot.

In operation, the DSP/memory module 40 is placed onto the system board of the computer in a slot connected to the memory bus 24. The DSP functions of the DSP/memory module 40 are initially transparent to the MPU 12; the DSP/memory module 40 operates as a standard memory module 26 until the DSP features are enabled. Once enabled (discussed in greater detail hereinbelow), the MPU 12 can control the DSP circuitry 44 through a plurality of control registers and pass data to and from the DSP circuitry 44 using some or all of the memory circuits 42.

Many applications in digital signal processing, speech, and image processing are structured and lend themselves to be partitioned and concurrently executed. With adequate on-chip memory, several self-contained tasks can be executed in parallel. Typically, there are small routines or operations that are applied to a very large set of data. For example, in speech or image recognition, the unknown input vector is compared against several stored reference vectors. Typically, a Euclidean distance is used as a similarity measure between the unknown vector and the known reference vector. This calculation involves fetching the reference vectors from memory to the MPU 12 where the unknown input vector is kept, performing the Euclidean distance calculation, and writing the computed result back to memory. Moving the large number of reference vectors to the MPU 12 increases the traffic of data on the bus. However, using the DSP/memory module 40, the input vector can be moved to the memory storing the reference vectors, previously loaded on the DSP/memory module 40, performing the Euclidean calculation locally, and storing the results locally. Now, the MPU 12 need only fetch the results from the DSP/memory module 40. This leads to several benefits. First, the data traffic on the buses is reduced since the MPU 12 must read only the compared results. Second, the MPU is free to perform other tasks while the DSP/memory module 40 performs the cycle intensive Euclidean computation. Third, due to reduced bus traffic, power consumption is reduced leading to increased battery life—an important feature for portable system users.

With the density of DRAM increasing, memory intensive applications, such as a voice dialing application, which typically requires a megabit of memory, can easily be supported on the DSP/memory module 40.

Figure 3:
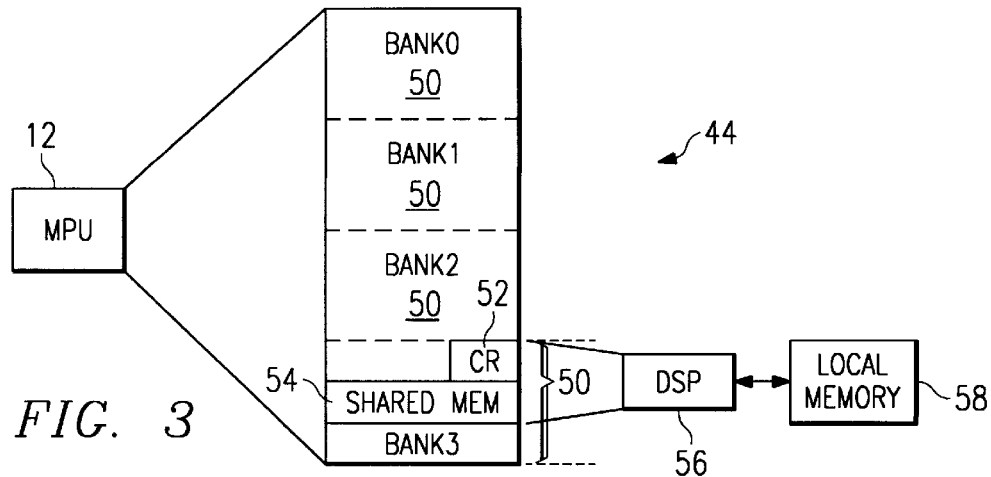
FIG. 3 illustrates the organization of memory space between the system MPU and the DSP on the DSP/memory module.

FIG. 3 illustrates a diagram showing the interaction between the MPU 12, memory circuits 42 and the DSP circuitry 44. The main memory of the computer system is generally divided into "banks," with each bank 50 comprising one or more memory modules. In the computer system of FIG. 3, four banks are shown, BANK0, BANK1, BANK2 AND BANK3. BANK3 contains the DSP/memory module 40 (although any bank could contain the module); in another instance, all the banks 50 may contain a DSP/memory module 40.

Each bank 50 has an associated address space, through which the MPU 12 addresses the memory (via the MMU 14). For a Pentium type processor, the address range is from 0 to 4 gigabytes. Typically, the actual memory addresses are in a much smaller range, for example, between 0 and 64 megabytes. Within the address space associated with BANK3, a certain range of addresses are allocated for control registers 52 associated with the DSP circuitry 44, used when the DSP circuitry is enabled. These control registers are described in further detail hereinbelow. Further, a portion of the memory can be designated as shared memory 54, i.e., for use with both the MPU 12 and the DSP 56 (multiple DSPs could also be used on a single module). DSP 56 is typically a digital signal processor, but could alternatively be any type of programmable processor. In addition to the main memory, the DSP circuitry 44 also has a local memory 58 (preferably a static random access memory) for temporary storage of information.

When the DSP circuitry 44 is not enabled ("standard mode"), the DSP/memory module 40 operates as a standard memory module. In the diagram of FIG. 3, the MPU 12 would have sole access to the entire memory address space of BANK3, just as it would any other memory bank 50. When the DSP/memory module 40 has its DSP circuitry 44 enabled ("smart mode"), the MPU 12 can write to the control registers 52 to control the DSP functions and can transfer data to and from the DSP circuitry 44 via the shared memory.

In a third mode, configuration mode, the MPU 12 can access the control registers 52 and local memory 54 present on the DSP/memory module 40, via the Index and Data registers that are in the memory space of the DSP/memory module 40. On powerup, these control registers 52 are located at the base of the address space of the DSP/memory module 40. The intent of the configuration mode is two fold. First, configuration mode enables the MPU 12 to read specific information regarding the DSP/memory module 40, referred to as the Module Information Structure (MIS). MIS contains information regarding the size of memory available on the DSP/memory module 40, size of the local memories, and the type of processor(s) available. The MPU 12 accesses this MIS and stores this information in its registry for future reference and actions. The MIS is typically stored in slow memories like ROM and the MPU 12 must poll the status bits in the DSPSR register before reading from the data register. The specific bits are explained further below. Second, the configuration mode is used to relocate the base address of the control registers 52 and the shared memory 54 to a desired address location within the boundary of the module. Note that the default base address is zero, i.e., the control registers are located at the starting address of the bank 50.

The following provides a preferred procedure for switching between modes. To switch from standard mode to configuration mode, the MPU 12 writes a signature pattern, n times, in succession, to the signature register (SIGR) located in its address space. This signature pattern is written a certain number of times, without doing any other accesses. For example, a signature pattern, "A320", could be written four times in succession to the SIGR register to enter configuration mode.

To switch from configuration mode to standard mode, the MPU 12 writes to the DSPLOC register the "relocation address" to which it wishes to relocate the control register's base address to be relocated. If it does not wish to relocate the control registers, a "0" is written to the DSPLOC registers. After writing the relocation address, the MPU 12 writes the signature pattern to the SIGR/Index register.

To switch from standard mode to smart mode, the MPU 12 writes a signature pattern (n+1) times, in succession, to the signature register (SIGR) located in its address space. This signature pattern is written a certain number of times, without doing any other accesses. For example, the signature pattern, "A320", is written five times in succession to the SIGR register.

If for any reason, the computer is reset, or shut-down, the driver in the OS will switch the module back to the standard mode before allowing the computer to shutdown. Alternatively, on power-up, the boot sequence might always force the module to be in standard mode.

Control Registers

Figure 9:
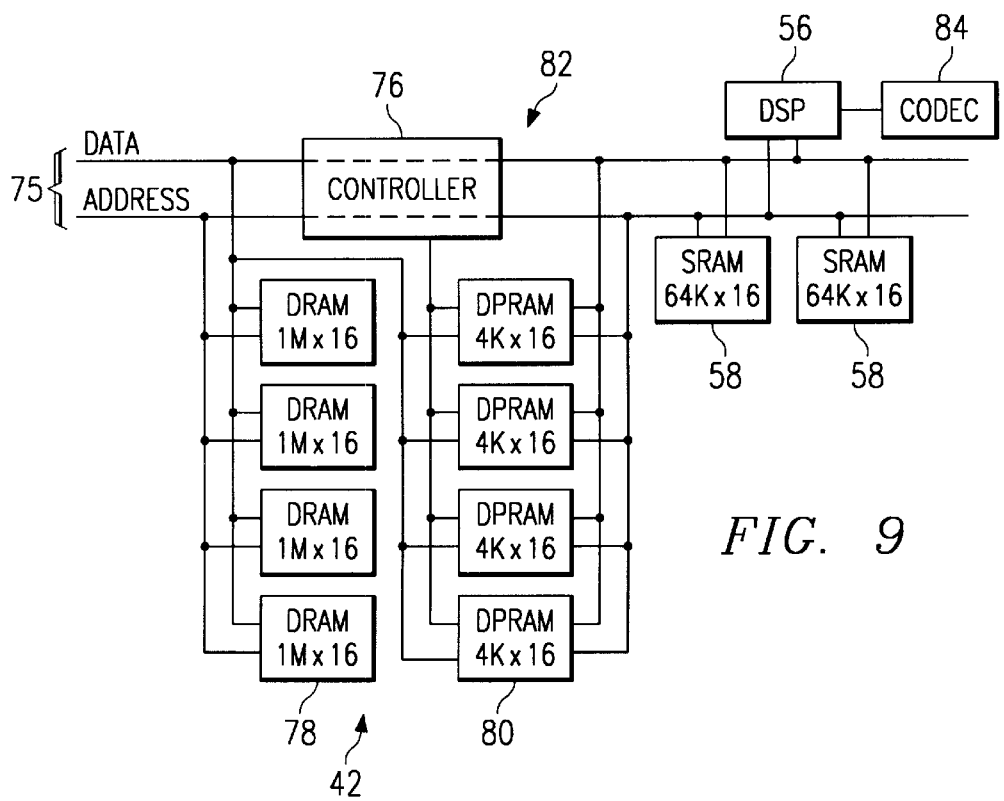
FIG. 9 illustrates a first embodiment of the DSP/memory module.
Figure 10:
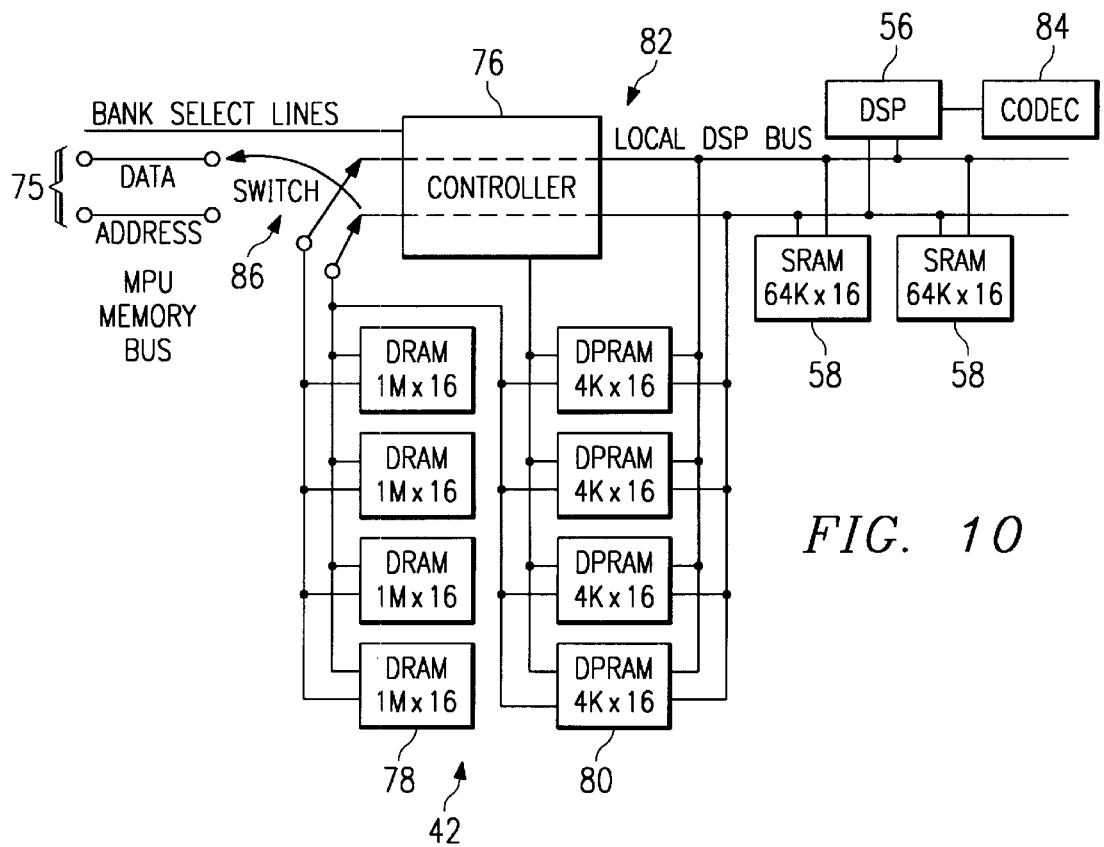
FIG. 10 illustrates a second embodiment of the DSP/memory module.
Figure 11:
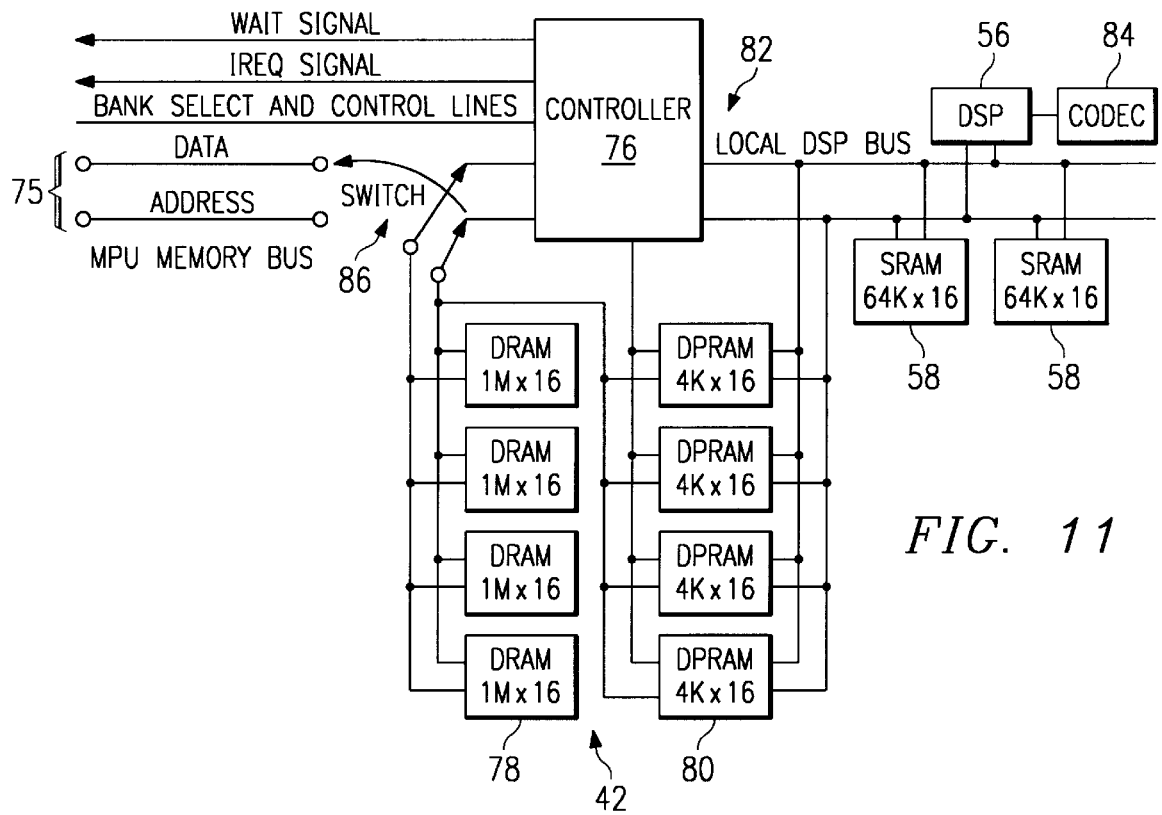
FIG. 11 illustrates a third embodiment of the DSP/memory module.

Control of the module's operating mode is accomplished via the signature, control, status, and communication registers defined in the module controller, shown in connection with FIGS. 9–11. Some of these are accessible only by the MPU 12, some only by the DSP 56, and some by both MPU 12 and DSP 56. Some of these registers are mapped in the memory space of the MPU 12 and I/O space of the DSP 56. Note that for both MPU 12 and DSP, some of these registers are "Reserved" as marked. In the standard mode, only the Signature Register (SIGR) is accessible to the MPU 12. Other registers exist only when the DSP/memory module 40 is in the configuration or smart mode of operation.

Initially, these registers are mapped into the first 32 bytes of the associated bank 50.

TABLE I

Control Registers in Standard Mode

| Register Name | Memory Address | | Default Value | Access | |
| --- | --- | --- | --- | --- | --- |
| | MPU Memory | DSP I/O Space | | MPU | DSP |
| SIGR | 0000h | — | XXXXh | R/W | — |

TABLE II

Control Registers in Configuration Mode or Smart Mode

| Register Name | Memory Address | | Default Value | Access | |
| --- | --- | --- | --- | --- | --- |
| | MPU Memory | DSP I/O Space | | MPU | DSP |
| SIGR/INDEX | 0000h | — | XXXXh | R/W | — |
| DATA | 0007h | — | XXXXh | R/W | — |

TABLE III

Control Registers in Configuration and Smart Modes, accessible via Index & Data Registers.

| Register Name | Memory Address | | Default Value | Access | |
| --- | --- | --- | --- | --- | --- |
| | MPU Memory | DSP I/O Space | | MPU | DSP |
| DSPLOC | Via Index & Data registers | — | 0000h | R/W | — |
| DSCR | Via Index & Data registers | — | XXXXh | R/W | — |
| DSPSR | Via Index & Data registers | — | XXXXh | R | — |
| DSPTxD | Via Index & Data registers | 0050h | 0000h | R | W |
| DSPRxD | Via Index & Data registers | 0051h | 0000h | W | R |
| LM_RW_ADDR | Via Index & Data registers | — | 0000h | R/W | — |
| LM_RW_DATA | Via Index & Data registers | — | 0000h | R/W | — |
| LM_AD_OFFSET | Via Index & Data registers | — | 0000h | R/W | — |

SIGR Register

The Signature (SIGR) register is defined only in the standard mode. The DSP/memory module 40 monitors all MPU writes to this location for valid signature pattern (while it writes to the standard memory typically available on the module). When the module operates in the configuration mode, this register is redefined as the Index Register. The module still monitors for a write of a signature pattern (for example, "A320") and if this occurs after a write to the DSPLOC register, then the module is switched back to the Standard mode. During the smart mode, this register is redefined as the Index Register.

Index Register

The Index Register which is available in the configuration and smart modes enables access to other registers like DSPCR, etc. The MPU 12 must write the address of the control registers that it wishes to access to this register.

Data Register

The Data register is a read/write register available in the Configuration and Smart modes. The MPU 12 writes the data to this register which is transferred by the module to the appropriate control register 52 whose address has been previously setup in the Index register.

The Index and Data registers have been defined to facilitate ease of hardware circuit implementation; since meeting the tight memory-access timings in Fast-Page mode are difficult to meet. Ideally all control registers 52 could be directly accessible by the host MPU 12.

DSPLOC Register

The DSPLOC is a 16-bit R/W register that allows the MPU 12 to relocate the base of the control registers 52 to another address in the MPU's address space, but still within the boundary of the module's address limits.

DSP Control Register (DSPCR)

The DSPCR, shown in FIG. 4a, is a 16 bit R/W register used to control DSP operation, interrupt of the MPU, memory bus arbitration, standard-smart mode switching, and level interrupt clear. Definition of individual bits are as follows.

Note that with the DSP specific bits, though some protections have been included, the operation is not fully automated. Thus, the user must program DSPCR while taking into consideration DSP operation. The DSPCR bits are explained in the following Table IV.

TABLE IV

DSPCR Operation

Bit0 DSP RESET: Writing a 0 to this bit resets the DSP 56. The MPU 12 must set this bit to 1 to start DSP operation. When doing this, at least two writes to DSPCR should occur. The first should write the appropriate configuration with RESET=0. The second write should do the same with RESET=1. The Default value is 0.

Bit1 SHARED MEM IN USE: This is a semaphore used in arbitrating access to shared memory.

Bit2 DSP CLKMD1: This bit selects the DSP master clock source and corresponds to the DSP CLKMD1 bit only (since CLKMD0 is tied low). The DSP RESET bit must be 0 when this bit is changed. When this bit is set to 0, CLKMD1 = 0 and the DSP is in divide-by-two mode so DSP's clock input is driven by the clock divider output (in SYSCFG) at a minimum instruction cycle of 100 ns. When this bit is set to 1, CLKMD1 = 1 and the DSP is in multiply-by-two mode so the DSP's clock input is the oscillator output with an instruction cycle time of 25 ns. The DSP should not be taken out of reset on the same write cycle that the clock is turned on; instead, two writes should be used. Note that in the 25 ns mode, the clock can only be turned off if the part is in IDLE2. The default is value for this bit is 0.

Bit3 DSP MP/-MC: This bit corresponds to the DSP MP/-MC pin. When it equals 1 and the DSP is taken out of reset, the DSP is in microprocessor mode and begins running out of external memory. Setting this bit to 0 sets the DSP MPI-MC pin = 0, thus allowing the part to be bootloaded when the DSP is taken out of reset. This means the DSP is brought up in microcomputer mode that causes the part to bootload code in from global data memory. The DSP can only bootload out of page 0 of global data memory. The default bit is 1. After bootload, this bit must be set to 1. The MP/-MC is multiplexed with -INT1 pin and this must be done for DSP interrupts to work correctly.

Bit4 TXINTEN: This bit is used by the MPU 12 to receive an interrupt when DSPTXD is written to by the DSP. When TXINTEN is set (1), TXFULL condition in the DSPSR will generate an interrupt to the MPU 12 allowing interrupt driven communications with the DSP. Writing a 0 will disable, but not clear the interrupt. The default value of this bit is 0.

Bit5 RXINTEN: This bit is used by the MPU 12 to receive an interrupt when DSPRXD is read by the DSP. When RXINTEN is set (1), RXEMPTY condition in the DSPSR will generate an interrupt to the MPU 12 allowing interrupt driven communications with the DSP. Writing a 0 will disable, but not clear the interrupt. The default value of this bit is 0.

Bit6 RESERVED: Local Memory Read/Write control flag. 0 = READ; 1 = WRITE; Default = 0

Bit7 DEVBUSYINTEN: This bit is used by the MPU 12 to receive an interrupt when MPU memory access timeout occurs. When DEVBUSYINTEN is set (1), DEVBUSYINT condition in the DSPSR will generate an interrupt to the MPU 12. This is an error condition and described. Writing a 0 will clear the interrupt. The default value for this bit is 0.

Bit8 MANUAL HOLD: Writing a 0 to this bit will set the -HOLD line to the DSP to 0. This keeps the DSP off the memory bus so that the MPU 12 may have uncontested, fully optimized access to the memory/DSP bus with no arbitration delay. The actual value of -HOLDA may be polled in DSPSR. This mode is good for block accesses of data to the memory/DSP bus. Default value for this bit is 1. (Note that when the DSP/memory module 40 is in standard mode, -HOLD = 0.)

Bit10-9 LM_ADR_CTRL: Local Memory address modification control after access to DATA register; 00 = No change; 01 = increment LM_RW_ADDR register by +1; 10 = decrement LM_RW_ADDR register by -1; 11 = use value in LM_AD_OFFSET to modify LM_RW_ADDR register. The default value is 00.

Bit 11 MAXOD (Maximum Overdrive): Writing a 0 to this bit causes any MPU 12 access to the module controller to -HOLD the DSP. This will of course slow down DSP operation, but guarantee no bus arbitration conflicts. Writing a 1 to this bit turns on the bus arbitration optimization that allows DSP and MPU 12 to access the module controller concurrently. When this bit is active any access to the module controller will NOT cause the DSP -HOLD signal to be applied low. The default value for this bit is 0.

Bit 12 IREQSERV (IREQ Service): In the case of either pulse or level interrupts, this bit must be cleared AND primed. This means that when MPU 12 is servicing an interrupt, a 1 must be written to this bit to clear it. And then a 0 MUST be written to this bit to prime it for the next interrupt. Otherwise -IREQ will not toggle again. This puts the time between IREQ's (and pulsed interrupts will pulse only once) fully in control of the MPU 12 programmer.

Bit14-13 LM_SPACE_SELECT: Local Memory space select. These two bits specify which space in the local memory space of the module should be selected. At present, Module Information

TABLE IV-continued

DSPCR Operation

Space(MIS), DSP Program Space(DSP_PM), and DSP Data Space(DSP_DM) are supported.
00 = MIS; 01 = DSP_PM; 10 = DSP_DM; 11 = not defined. Default is 00.
Bit 15 MODCTL: When the MPU 12 switches the DSP/memory module 40 to smart mode by writing the signature to SIGR, this bit will be set to 1. (Note that it will not be latched until a write occurs to DSPCR). Writing a 0 to this bit will reset the smart mode and force the DSP/memory module 40 to the standard mode. When writing to this register, always be sure to write 1 to this bit or that DSP/memory module 40 will switch to standard mode. Also note that writing 0 will not take the DSP/memory module 40 out of smart mode if MODE bit in the COR's is 1. Default value for this bit is 0.

DSP Status Register

The DSPSR, shown in FIG. 4b, is a read-only, 16-bit register. It is used to monitor DSP operation, module interrupt of the MPU 12, and memory/DSP bus arbitration. Definition of individual bits are as follows in Table V:

TABLE V

DSPCR Bit Operation

Bit1-0 RESERVED: These bits are reserved and may reflect any value that has no relevance to the operation of the DSP/memory module 40.
Bit2 DSP CLKMD1: This bit indicates the value of the DSP CLKMD1 line. When CLKMD1 = 1, the DSP is in multiply-by-two mode. When CLKMD1 = 0, the DSP is in divide-by-two mode. Note that CLKMD1 may only be changed when -RS = 0.
Bit3 RESERVED: This bit is reserved and may reflect any value that has no relevance to the operation of the DSP/memory module 40.
Bit4 TXFULL: This bit is set to 1 when DSP writes a new data value to the DSPTXD. This bit is cleared (0) when MPU 12 completes a read from the DSPTXD. DSP should only write to DSPTXD when TXEMPTY is set (to 1) in the PCSR. This bit is set to 0 (cleared) at power up.
Bit5 RXEMPTY: This bit is set to 1 after DSP reads from DSPRXD. It is cleared when MPU 12 writes new data to DSPRXD. MPU 12 should only write to DSPRXD when RXEMPTY is 0. If MPU 12 writes to DSPRXD when RXEMPTY is 0 previous data in DSPRXD will be overwritten. Its default value is 1.
Bit6 LM_DATA_RDY: This bit is used to flag when the data register is ready to be accessed by the MPU. This bit is set to 1 by the hardware circuitry when LM_RW_DATA register is ready to be accessed(Read or Write); it is automatically set to 0 when the LM_RW_DATA register is accessed. This bit is defined to support access to slow local memory chips, such as Flash, which may have speeds that are slower than the MPU access speeds to the module. Default is 0.
Bit7 DEVBUSYINT (Device Busy Interrupt): This bit is set to 1 after MPU 12 requests access the memory bus and does not receive access proper access. This is an error condition and thus data read is invalid and data written is unsuccessful. This bit is reset at the beginning of every memory/DSP bus access and set to one if a timeout occurs. It should be read after a questioned access. Thus after an invalid access, the only way to clear this bit to 0 is to get a valid access or reset the module controller. This operation is necessitated by the DSP's operation of -HOLD, -HOLDA, and READY. The default is 0. Note that the use of a long software wait state on the MPU 12 side will cause this bit to go active.
Bit8 DSP -HOLDA: This bit reflects the value of the -HOLDA (Hold Acknowledge pin) of the DSP.
Bits10-9 RESERVED: These bits are reserved and may reflect any value that has no relevance to the operation of the DSP/memory module 40.
Bit11 PDH (Please Don't Hold Me): This bit is a direct copy of the PDR bit in the DSP SYSCFG register. When PDH = 1, the DSP is requesting the MPU 12 not to access the memory bus. The MPU 12 may ignore the request and access the memory bus at the risk of slowing down the DSP's code execution. Note that according to round robin bus arbitration operation, the DSP will have to finish any started bus cycles when accessing DSPSMMR's and global data memory before the MPU 12 can begin access. The only way to guarantee MPU access is to assert -HOLD to the DSP either by MANUAL HOLD = 0 or MAXOD = 0.
Bit15-12 RESERVED: These bits are reserved and may reflect any value that has no relevance to the operation of the DSP/memory module 40.

DSP Data Transmit Register

DSPTXD is a 16 bit register used by the DSP to communicate to the host MPU 12. The MPU 12 has only read access to this register and any MPU write to this register is ignored. The DSP has only write access to this register and any DSP read from this register causes invalid data to be read. A DSP write to this register generates a TXFULL interrupt to the MPU 12 if enabled. Similarly, an MPU 12 read from this register generates a TXEMPTY interrupt to the DSP if enabled.

DSP Data Receive Register

DSPRXD is a 16 bit register used by the MPU 12 to communicate to the DSP. The MPU 12 has only write access to this register and any MPU 12 read from this register causes invalid data to be read. The DSP has only read access to this register and any DSP write to this register is ignored. A DSP read from this register generates a RXEMPTY interrupt to the MPU 12 enabled. Similarly a MPU 12 write to this register generates a RXFULL interrupt to the DSP if enabled.

MPU 12 Status Register

The PCSR, shown in FIG. 4c, is a 16 bit read-only register to the DSP located at I/O address 0052h when the DSP/memory module 40 is in smart mode. It is used by the DSP space to determine status of the host communication registers. Its bits are defined in Table VI.

TABLE VI

PCSR Bit Operation

Bit0 TXEMPTY: This bit is set to 1 after MPU 12 reads new data from DSPTXD. It is cleared (0) when DSP writes new data to DSPTXD indicating new data is available for MPU 12. This bit directly drives the -INT4 pin of the DSP generating a communication transmit interrupt to the DSP. The default value for this bit is 1.

Bit1 RXFULL: This bit is set to 1 when MPU 12 writes new data to the DSPRXD. This bit is cleared (0) when DSP completes a read from the DSPRXD. MPU 12 should only write new data to DSPRXD when RXEMPTY in the DSPSR is clear (0). This bit directly drives the -INT4 pin of the DSP generating a communication receive interrupt to the DSP. The default value for this bit is 0. Note that if DSP MP/-MC bit must be equal to 1.

Bit I/O Register (Reserved)

The BIOR is a 16 bit read/write||read-only register to the DSP located at I/O address 0053h when the DSP/memory module 40 is in Smart Mode. BIOR receives information from an analog front end (described in connection with FIG. 12) so that the DSP/memory module 40 can receive information through external signals, such as a line-in/out, microphone input, telephone line or cellular connection.

System Configuration Register

The SYSCFG register, shown in FIG. 4d, is a 16 bit read/write register to the DSP located at I/O address 0054h when the DSP/memory module 40 is in Smart Mode. It is used by the DSP to control the frequency of the clock input to the DSP when CLKMD1=0, bus arbitration, Global Data paging, external memory configuration and paging.

TABLE VII

SYSCFG Bit Operation

Bit1-0 CLKD0-CLKD1: The clock divider select bits 1-0 selects the divider for the 50 ns clock (when CLKMD1 = 0) as follows:

| CLKD1-CLKD0 VALUE | DIVIDER | CLKOUT1 VALUE |
| --- | --- | --- |
| 00 | 1 | 100 ns |
| 01 | 2 | 200 ns |
| 10 | 4 | 400 ns |
| 11 | 8 | 800 ns |

Bit2 DSPTXDINTEN: This bit is used by the DSP to receive an interrupt when DSPTXD is read by the MPU 12. When DSPRXDINTEN is set (1), TXEMPTY condition in the PCSR will generate an interrupt to the DSP allowing interrupt driven communications with the MPU 12. Writing a 0 will disable, but not clear the interrupt. The default value of this bit is 0.

Bit3 PDH (Please Don't Hold Me): This bit is reflected as the PDH bit in the DSPSR register that requests the MPU 12 not to access the memory bus when PDH = 1. The MPU 12 may ignore the request and access the memory bus at the risk of slowing down the DSP's code execution. Note that due to DSP bus arbitration operation, the DSP will have priority to SMM registers and global data memory. The only way to guarantee MPU 12 access is -HOLD the DSP.

Bit5-4 RESERVED: 0 should always be written to these bits or unknown conditions may occur.

Bit6 DSPRXDINTEN: This bit is used by the DSP to receive an interrupt when DSPRXD is written to by the MPU 12. When DSPRXDINTEN is set (1), RXFULL condition in the PCSR will generate an interrupt to the DSP allowing interrupt driven communications with the MPU 12. Writing a 0 will disable, but not clear the interrupt. The default value of this bit is 0.

Bit7 RESERVED: 1 should always be written to this bit or unknown operation may occur.

Bit11-8 RESERVED: 0 should always be written to these bits or unknown conditions may occur.

Bit15-12 RESERVED: 0 should always be written to these bits or unknown conditions may occur.

Hunting Protocol

Figure 5:
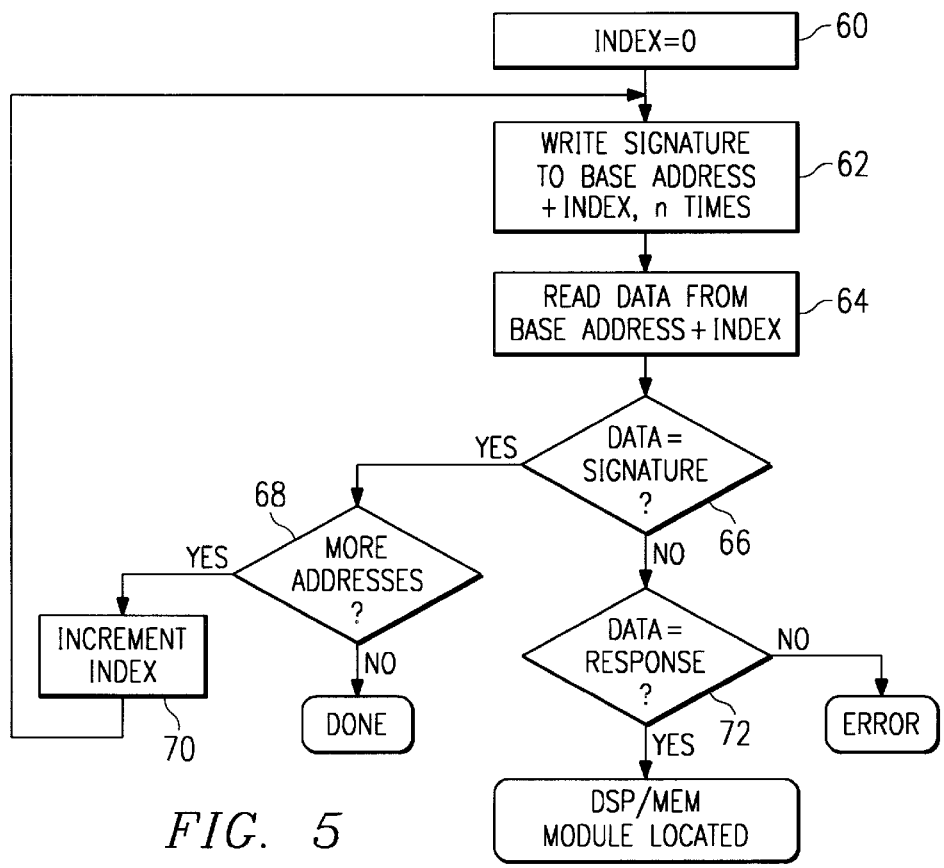
FIG. 5 illustrates a flow chart describing the operation of a hunting protocol for determining whether a DSP/memory module is located in the main memory of a computer.

If the appropriate driver is installed before the DSP/memory module 40 is plugged in, when the system power is cycled, the driver is invoked, and it automatically searches the entire-space to identify where the DSP/memory module 40 located. The protocol and procedure for identifying where the DSP/memory module 40 is located is referred to as the hunting protocol. The MPU 12, under control of the driver, locates the DSP/memory module 40 as shown in FIG. 5.

In blocks 60 and 62, MPU 12 writes a signature or fixed pattern, e.g. A320, n times to each memory location starting from one end of the memory space and working upwards(or downwards). n is a number that is typically 4, but could be any other number; however, it has to be specified in the driver which is decided by the hardware. This fixed pattern is referred to as the signature pattern.

In block 64, MPU 12 reads the memory location where it wrote the fixed pattern. If, in decision block 66, the value read is identical to the value that was written, then the MPU 12 increments the address counter and proceeds to repeat the above process for the next consecutive memory location (blocks 68 and 70).

If the value read is not identical to the value just written in decision block 66, and if it is equal to a predetermined response value (for example, the complement of the signature) in decision block 72, the driver assumes it has located the DSP/memory mode 40. This address value is the address of the Signature Register (SIGR). The driver remembers this address for future reference. If the data read is not equal to the response value in decision block 72, then an error has occurred.

Memory Mapping

Configuration Mode

Figure 6:
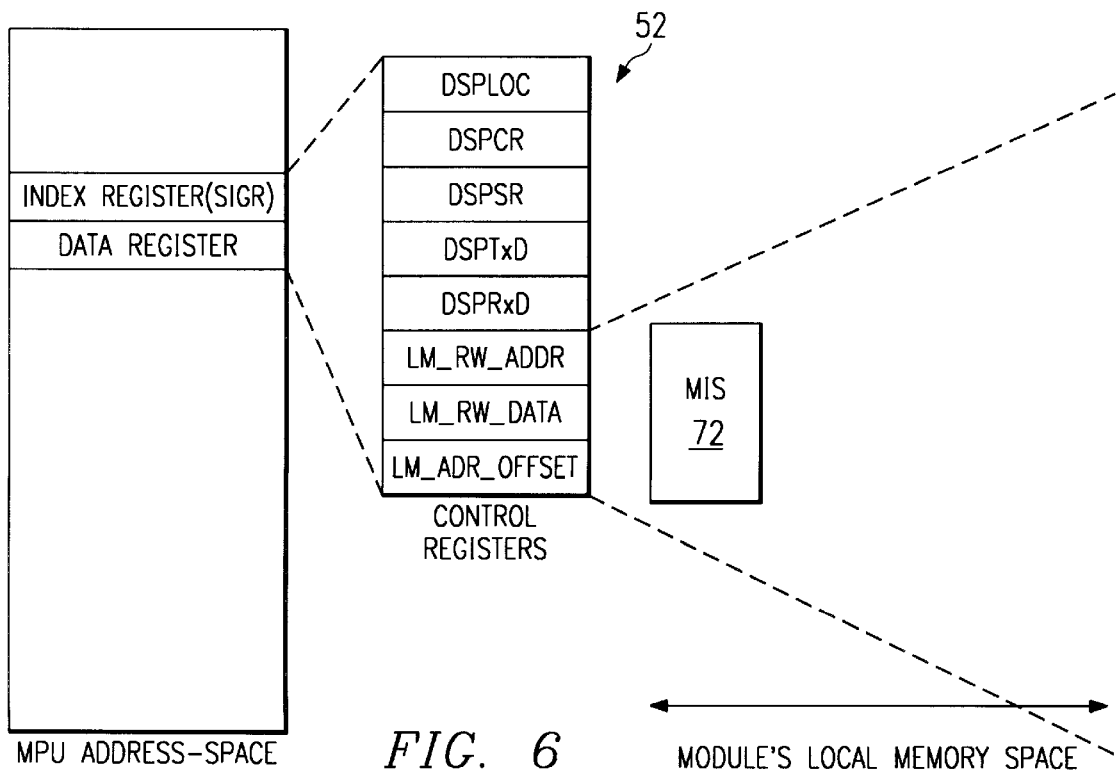
FIG. 6 illustrates a memory map in standard mode.

FIG. 6 illustrates the memory map as seen by the MPU 12 when the DSP/memory module 40 is in configuration mode.

As described above, when the MPU 12 decides to use the DSP circuitry 44 on the DSP/memory module 40, it writes the signature pattern, n times, to the SIGR register directly. This switches the module to the configuration mode. The DSP 56 on the module is still not powered. The MPU 12 can access several addresses following the SIGR register to obtain information regarding the module. This can be in the form of a header that is several bytes long stored in a module information structure (MIS) memory 72. This header will specify the type of DSP(s) on the DSP/memory module 40, whether the DSP/memory module 40 is a 32-bit or 16-bit processor, the size of local memory 58 associated with the DSP, the size of the memory on the DSP/memory module 40, and other related information. The driver saves this Configuration Header for future reference. (And if for some reason the power is recycled on the PC, then the DSP/memory module 40 should always boot-up in the standard mode.)

Using the appropriate control registers 52 that are now available, following the SIGR register, the MPU 12 downloads program and data to the DSP's local memory 58. (This means that the local memory associated with the DSP 56 must be powered up, but the DSP 56 should still be off).

The DSPLOC register, available in the configuration mode, allows the MPU 12 to relocate the SIGR and other control registers to another location on the DSP/memory module 40. Even if the MPU 12 decides not to relocate the control registers 52 to a new address, it must still write a zero to the DSPLOC registers. The MPU 12 now writes the signature pattern, A320, to the SIGR register to switch the module from configuration mode back to standard mode.

Smart Mode

When the MPU 12 invokes the power of the DSP 56 on the DSP/memory module 40, it will first determine if there is memory available on the module. Some current application programs may have allocated memory in the address space of the DSP/memory module 40. Hence, the MPU 12 will move any existing application memories to new locations. Alternatively, the MPU 12 may decide to relocate the control registers to another address on the DSP/memory module 40. In order to relocate the address of the control registers 52, the MPU 12 enters the configuration mode of the DSP/memory module 40, described above. The DSPLOC register in the configuration mode allows the MPU 12 to relocate the SIGR register and other shared registers to another location on the DSP/memory module 40; this flexibility is required since the MPU 12 may have previously allocated an application on the DSP/memory module 40 which has memory allocated that overlaps on the SIGR register. Then the MPU 12 will switch from configuration mode to standard mode and from standard mode to smart mode. In smart mode, the MPU 12 will download the necessary digital signal processing program(s) and data to the local memory 58 of the DSP 56. By writing to the control register, the MPU 12 can start the DSP 56.

In addition to writing to the base register, the MPU 12 writes to a Shared Memory Size register on the SRAM associated with the DSP, which specifies the amount of shared memory between the host MPU 12 and the DSP 56. Shared memory is accessible by both the MPU 12 as well as the DSP 56.

Figure 7:
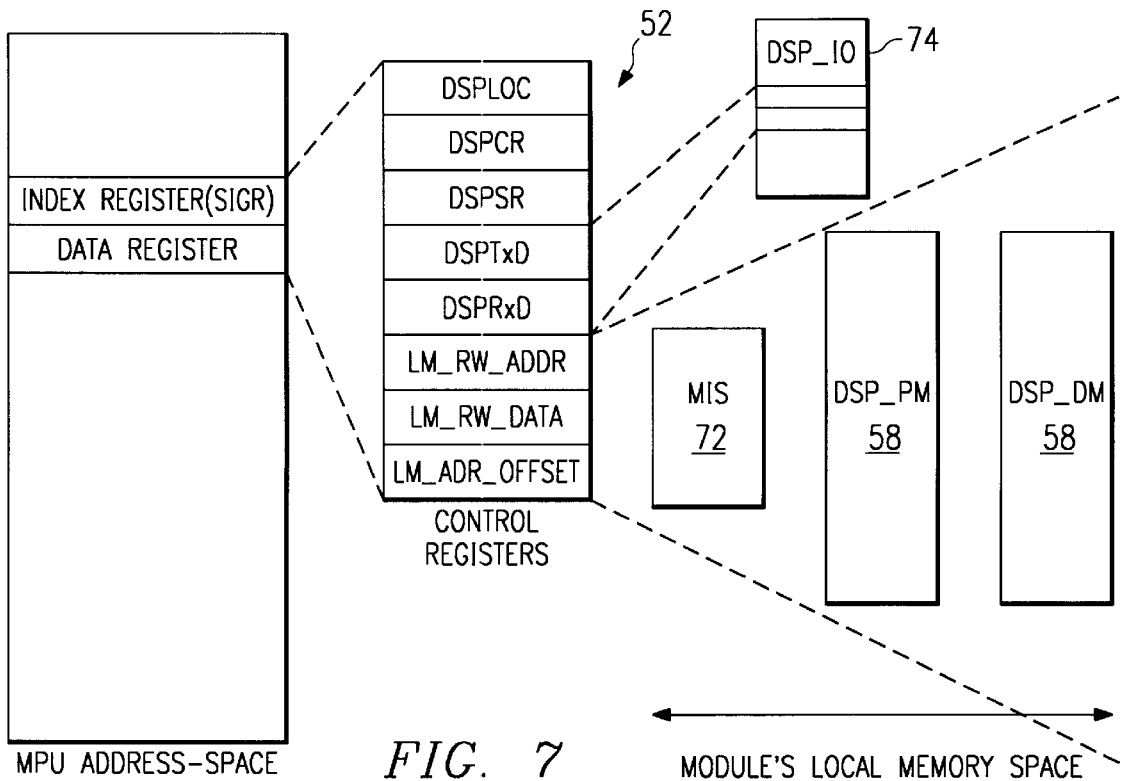
FIG. 7 illustrates a memory map in smart-local mode.

If the shared memory was specified by the MPU as zero, then the DSP/memory module 40 is said to be in the smart-local mode. In this case, only the control registers 52 are accessible by the MPU. A diagram of the memory map seen by MPU 12 in smart-local mode is shown in FIG. 7. In this mode, the MPU can read and write from the control registers 52. Through the control registers 52, the MPU can access the MIS 72 and local memory 58 (DSP_PM is the DSP's local program memory and DSP_DM is the DSP's local data memory) through control registers LM_RW_ADDR, LM_RW_DATA and LM_ADR_OFFSET, and the MPU 12 can access the I/O registers 74 of the DSP 56 through control registers DSPTxD and DSPRxD.

Figure 8:
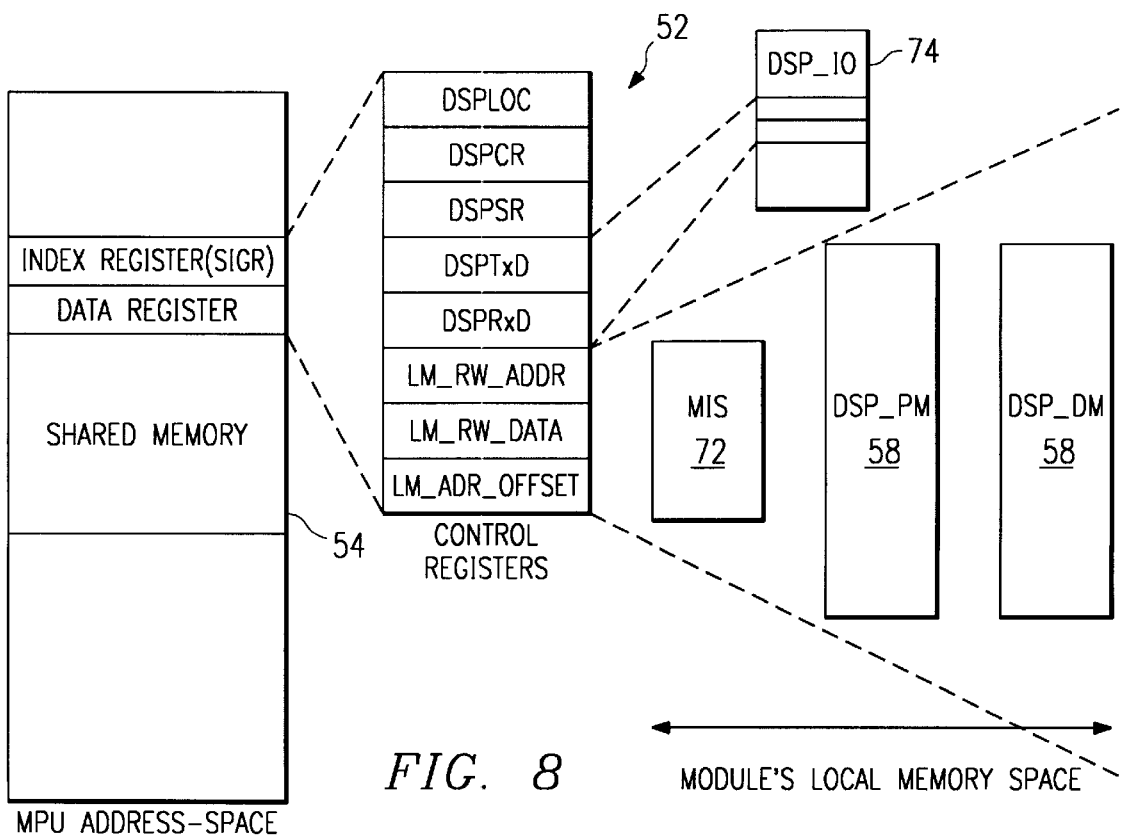
FIG. 8 illustrate a memory map in smart-shared mode.

However, if the shared memory was specified by the MPU as a non-zero value, then the mode is referred to as the smart-shared mode. In this mode the specified amount of memory is available as shared memory 54 between the MPU and the DSP(s). FIG. 8 illustrates the memory map seen by the MPU 12 in smart-shared mode.

In smart-shared mode, the MPU 12 first reads the semaphore bit, tests it to decide if the shared memory is currently being accessed by the DSP, and if it is not being used, the MPU 12 will set the semaphore bit prior to accessing the shared memory (and return the bit to "0" once the access is complete). However if the semaphore bit is already set, indicating that the DSP 56 is currently accessing the shared memory 54, MPU 12 can write a "1" to the Shared Memory request bit (referred to as Manual Hold bit in the DSPCR register). This write is detected by the hardware module on the DSP/memory module 40. The module controller now does the appropriate actions to put the DSP 56 on hold; i.e., the module controller will stop the DSP's access to the shared memory 54, and return the access of the shared memory 54 to the MPU 12. The Shared Memory Request bit therefore allows the MPU to demand access to the shared memory, even though it is being used by the DSP 56.

Alternatively, this protocol can be avoided to speed accesses to the shared memory 54. However, avoiding the protocol requires hardware which can switch quickly enough to respond to MPU shared memory requests or the use of dual port DRAMs.

Module Implementations

FIGS. 9–12 illustrate different embodiments for the DSP/memory module 40 and DSP circuitry 44. In FIG. 9 an embodiment is shown where the data and address buses 75 from MMU 14 (see FIG. 1) are received by module controller 76. The memory and address buses 75 are also connected to one or more DRAMs (dynamic random access memories) 78 which form the conventional memory on the DSP/memory module 40. In addition, one or more DPRAMs (dual ported random access memories) 80 are coupled to the module controller. The DPRAMs are mapped by the module controller 76 to the address specified as the shared memory. The outputs of the DPRAMs 80 are coupled to a DSP local bus 82 connecting the module controller 76 with the DSP(s) 56, shared memory 58 and (optionally) a CODEC (compressor/decompressor) 84.

This module has the standard memory bus signals coming into it from the MMU. For example there are address lines, data lines, and control lines that are typically found in a SIMM, DIMM, or other memory expansion modules found in notebook computers, PCs and PDAs. This prototype supports the standard, configuration and smart modes of operation as discussed above.

In operation, the DRAM 78 on the module is not shared between the MPU 12 and the DSP(s) 56. In standard mode, the MPU 12 reads and writes to the DRAM 78 which spans the entire memory space of the DSP/memory module 40. In smart mode, however, the module controller 76 passes reads and writes by the MPU 12 to the shared memory 54 to the DPRAMs 80, instead of to the corresponding locations in the DRAMs 78. The DSP 56 can read and write only to the DPRAMs 80, not to the DRAMs 78. This architecture reduces memory access conflicts between the MPU 12 and the DSP 56.

The control registers 42 and the MIS 72 could be implemented within the module controller 76.

In FIG. 10, a second embodiment of the DSP/memory module 40 is shown, wherein the module controller 76 switches access to the DRAMs 78 between the data and address bus 75 and the DSP local bus 82 through switch 86. In this embodiment, the DSP 56 can read and write to the DRAMs 78. However, the MPU 12 has a higher priority to the shared addresses in the DRAMs 78; when both the DSP 56 and MPU 12 try to access the DRAM 78 simultaneously, the module controller puts the DSP 56 on hold and switches to the MPU memory bus 75.

The MPU memory bus 75 is a typical memory bus consisting of the usual data, address, and control lines. The MPU's access to the DRAMs 58 is transparent, i.e., the module controller 76 accomplishes the switch such that the MPU 12 does not incur any delays. As far as the MPU 12 is concerned, it incurs the same delay in accessing the DRAM 78 if the module were to contain only the DRAM 78 as in a normal memory expansion module.

In order to provide transparent switching, it may be necessary to use DRAMs 78 which are of a higher speed rating than the stated speed rating of the DSP/memory module 40. For example, in order to provide a 70 ns DSP/memory module 40, it may be necessary to use 60 ns DRAMs 78 to compensate for the slight switching delay.

FIG. 11 illustrates a third embodiment of the DSP/memory module 40. In this embodiment, because of delays in switching between the MPU memory bus 75 and the DSP local bus 82, a WAIT signal is provided. This signal can be asserted during a switch between buses to hold the MPU access while the switch is occurring. The WAIT signal may be implemented by using an additional line or by using a combination of the existing standard memory bus signals, e.g., a unique combination of the refresh and write enable signals which would notify the MMU, and the MPU 12, that a WAIT had been asserted. Alternatively, a separate signal line or pin may be allocated in future standard memory modules.

In addition, this embodiment also supports an Interrupt Request Signal (IREQ) that allows the module to send an interrupt to the external device such as an MPU 12. The interrupt may be used, for example, to notify the MPU 12 that the DSP has completed its demanded task. For instance, the MPU 12 could place data in shared memory for translation to wavetable sounds, and the DSP could interrupt the MPU when the operation was complete, in order to allow the MPU 12 to work on other tasks while the transformation was being performed by the DSP 56. The IREQ signal may be implemented by using a combination of the existing standard memory bus signals, e.g., a combination of the refresh and write enable signals may be used to signal the host of a pending service request. Alternatively, a separate signal line or pin may be allocated in a future standard memory module design.

The following sections describe ways to implement the WAIT and IREQ signals. Six options are discussed, showing how these signals may be connected and handled by a host controller. (The host controller is also referred to as the memory controller 76 in this document.) We discuss these signals for memory modules (MMs) 98; in the examples shown below, we have considered Dual-in-line memory-modules(DIMMs) with either Fast Page Mode (FPM), Extended Data Output (EDO), Synchronous (S) or Double Data Rate Synchronous (DDR-S) Dynamic Random Access Memories (DRAMs). However these teachings are applicable to other types of memory/memory modules as well. Each of these DIMMs 98 have two or more banks of memory.

Implementation of IREQ and Wait Signals Option 1: One Wait Signal and One Interrupt Signal for Each Bank DIMM Impact This option shall add 4 signals to each DIMM module 98, /MWAIT0 signal 101, MWAIT1 signal 102, /MIRQ0 signal 103, and /MIRQ1 signal 104.

Figures 13, 14:
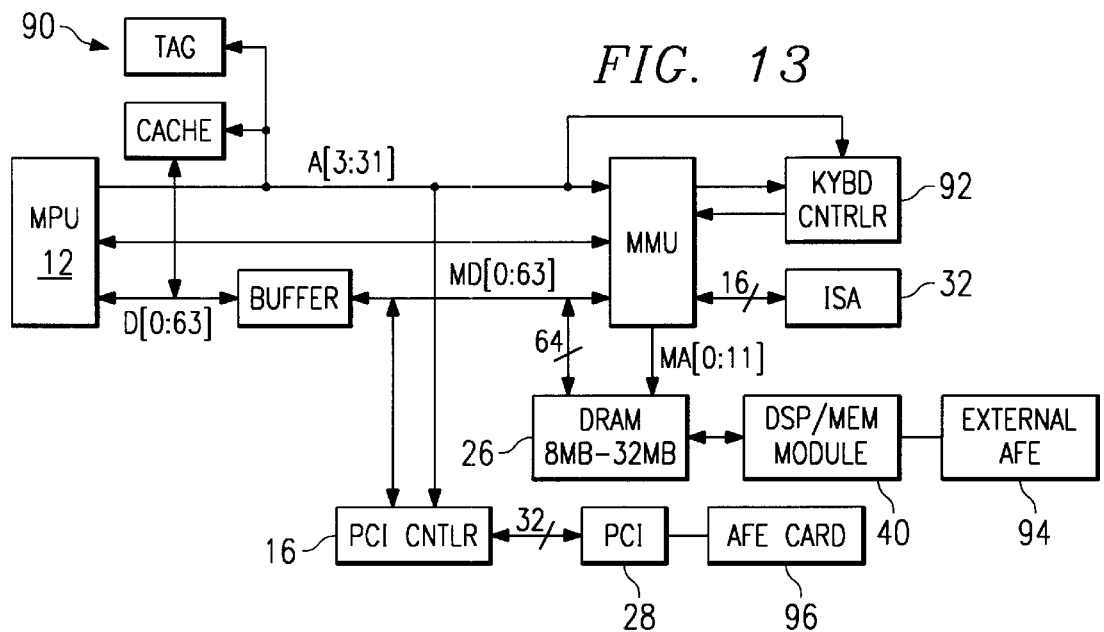
FIG. 13 illustrates a DS/memory module in a computer system using an analog front end coupled to the memory module via a local bus card.
FIG. 14 illustrates the memory module(s) to host controller block diagram as discussed in "IMPLEMENTATION OF IREQ AND WAIT SIGNALS: OPTION 1"

See the block diagram in FIG. 14.

Memory Controller Impact

The memory controller shall have one /MWAITn signal (101 or 102) and one /MIRQn signal (103 or 104) added for each of n banks. Thus 2n extra pins are needed where n is the total number of memory banks.

The memory controller 76 shall include the necessary logic to comprehend the added signals above.

The memory controller 76 shall include setup registers 76a (if needed).

See the block diagram in FIG. 14.

Signal List and Description

TABLE VIII

Signal List and Description (EDO/FPM DRAM)

Figure 15:
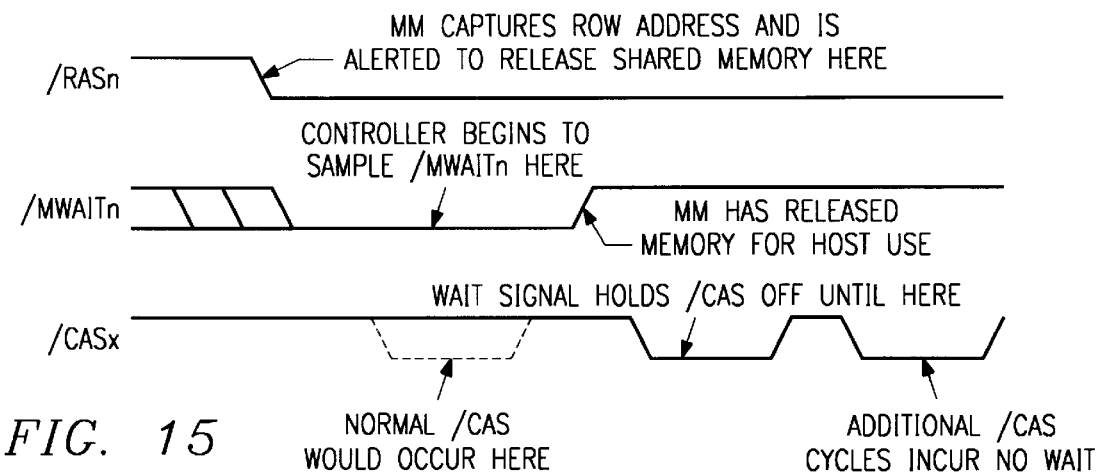
FIG. 15 illustrates the timing for the WAIT signal for FPM or EDO DRAM as discussed in "IMPLEMENTATION OF IREQ AND WAIT SIGNALS: OPTION 1"

/MWAIT0: Memory WAIT flag for DIMM bank 0. This is an active-low signal driven by the MM indicating that this bank of DRAM is temporarily busy. After the falling edge of /RAS0 (row address strobe), the memory controller 76 must begin to sample /MWAIT0. If low, then /MWAIT0 will be driven high shortly after the falling edge of /RAS0, indicating that the MM has relinquished the shared memory back to the controller. At this point, the controller may assert /CAS (column address strobe). The MM may only initiate a falling edge on /MWAIT0 when /RAS0 is high, thus further accesses to the same page of this bank will incur no wait. For compatibility with MMs that do not drive this signal, it shall be pulled up on the host PCB or in the host controller. See FIG. 15 for signal timing.

/MWAIT1: Memory WMT flag for DIMM bank 1. This is an active-low signal driven by the MM indicating that this bank of DRAM is temporarily busy. After the falling edge of /RAS1, the memory controller must begin to sample /MWAIT1. If low, then /MWAIT1 will be driven high shortly after the falling edge of /RAS1, indicating that the MM has relinquished the shared memory back to the controller. At this point, the controller may assert /CAS. The MM may only initiate a falling edge on /MWAIT1 when /RAS1 is high, thus further accesses to the same page of this bank will incur no wait. For compatibility with MMs that do not drive this signal, it shall be pulled up on the host PCB or in the host controller. See FIG. 15 for signal timing.

TABLE VIII-continued

Signal List and Description (EDO/FPM DRAM)

/MIRQ0: Memory Interrupt ReQuest for DIMM bank 0. This is a signal indicating that this bank is requesting an interrupt of the host. A falling edge on this signal indicates an interrupt request. For compatibility with MMs that do not drive this signal, it shall be pulled up on the host PCB or in the host controller.
/MIRQ1: Memory Interrupt ReQuest for DIMM bank 1. This is a signal indicating that this bank is requesting an interrupt of the host. A falling edge on this signal indicates an interrupt request. For compatibility with MMs that do not drive this signal, it shall be pulled up on the host PCB or in the host controller.

TABLE IX

Signal List and Description (DDR-S/SDRAM)

Figure 16:
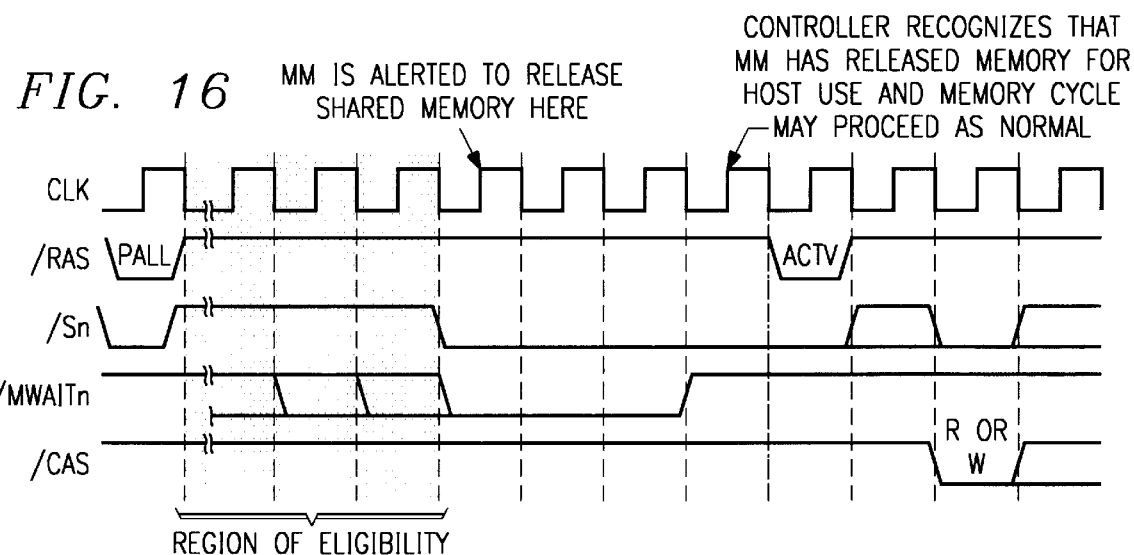
FIG. 16 illustrates the timing for the WAIT signal for DDR-S/S DRAM, eligibility option 1, as discussed in "IMPLEMENTATION OF IREQ AND WAIT SIGNALS: OPTION 1"
Figure 17:
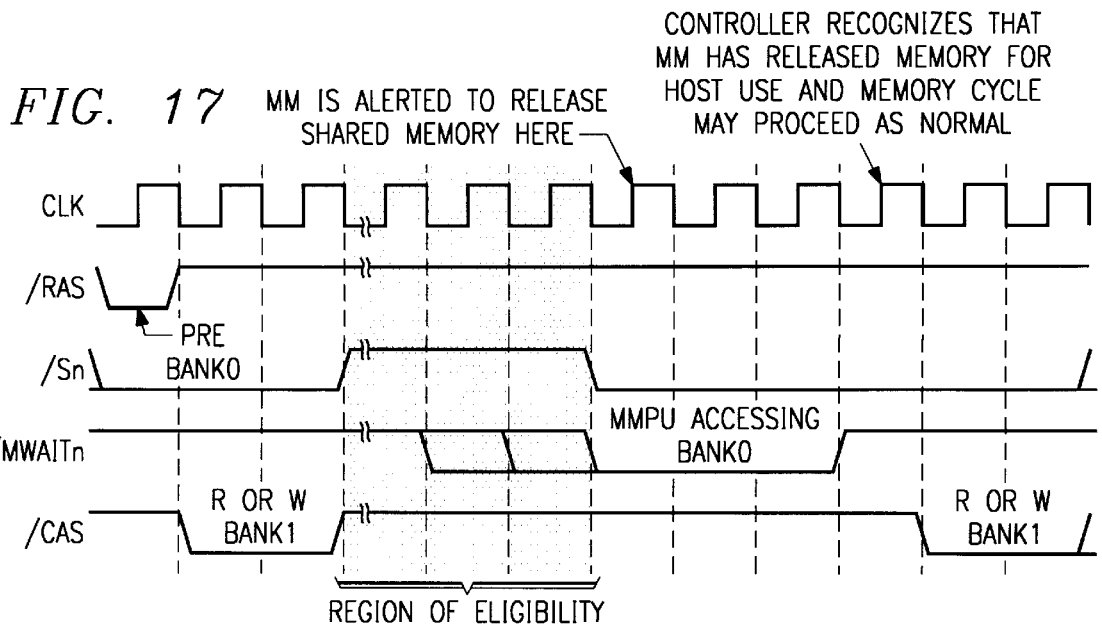
FIG. 17 illustrates the timing for the WAIT signal for DDR-S/S DRAM, eligibility option 2, as discussed in "IMPLEMENTATION OF IREQ AND WAIT SIGNALS: OPTION 1"

/MWAIT0: Memory WAIT flag for DIMM bank 0. This is an active-low signal synchronous with the memory bus clock. It is driven by the MM to the memory controller indicating that this bank of SDRAM is temporarily busy. The MM may only initiate a falling edge on /MWAIT0 when the SDRAM in this particular bank is eligible for DSP access. A falling edge on the /S0 input will always end the period of eligibility, requesting host access of the memory. If the /S0 input is driven low while /MWAIT0 is low, then /MWAIT0 will be driven high shortly after this point, indicating that the MM has relinquished the shared memory back to the controller. At this point, the controller may continue (or begin) a memory cycle with no further delay. See the "eligibility" section and FIGS. 16–18. For compatibility with MMs that do not drive this signal, it shall be pulled up on the host PCB or in the host controller.
/MWAIT1: Memory WAIT flag for DIMM bank 1. This is an active-low signal synchronous with the memory bus clock. It is driven by the MM to the memory controller indicating that this bank of SDRAM is temporarily busy. The MM may only initiate a falling edge on /MWAIT1 when the SDRAM in this particular bank is eligible for DSP access. A falling edge on the /S1 input will always end the period of eligibility, requesting host access of the memory. If the /S1 input is driven low while /MWAIT1 is low, then /MWAIT1 will be driven high shortly after this point, indicating that the MM has relinquished the shared memory back to the controller. At this point, the controller may continue (or begin) a memory cycle with no further delay. See the "eligibility" section and FIGS. 16–18. For compatibility with MMs that do not drive this signal, it shall be pulled up on the host PCB or in the host controller.
/MIRQ0: Memory Interrupt ReQuest for DIMM bank 0. This is a signal indicating that this bank is requesting an interrupt of the host. A falling edge on this signal indicates an interrupt request. For compatibility with MMs that do not drive this signal, it shall be pulled up on the host PCB or in the host controller.
/MIRQ1: Memory Interrupt ReQuest for DIMM bank 1. This is a signal indicating that this bank is requesting an interrupt of the host. A falling edge on this signal indicates an interrupt request. For compatibility with MMs that do not drive this signal, it shall be pulled up on the host PCB or in the host controller.

Memory Eligibility for DSP Access (DDR-S/SDRAM Only)

Unlike conventional DRAMs, synchronous DRAMS have 2 or 4 internal banks. Because of this feature, the memory controller has the ability to open 2 or 4 pages at a time and instantly switch between them for read and write access. This feature makes the eligibility of DSP access to the memory slightly more complicated than with conventional DRAMs. A set of rules for eligibility must be defined.

Option 1: The shared SDRAM is only eligible for DSP access when all pages are known to be closed (after a PALL command). This will ensure that there are no page conflicts between the host and the DSP. After the point of memory eligibility, the host controller must drive /Sn low and monitor the wait signal before issuing any new commands. The ACTV command can then be asserted in the cycle following the cycle where /MWAITn is sampled as high. This option would work most efficiently if the host controller closed all pages at the end of every memory access. This option treats the SDRAM much like a (single bank) standard DRAM. See FIG. 16.

Option 2: The memory is eligible for DSP access on a bank-by-bank basis after the host controller executes a READA, WRITEA, or PRE command for the specific bank that the DSP wishes to access. This approach is slightly less straightforward and would require the DSP to monitor the bank that the host controller is currently accessing. Also, the DSP may not gain access to the memory directly after one of these three commands, for the host controller may choose to immediately execute a WRITE or READ command on a different internal bank. When the desired bank is known to be precharged, the memory is eligible for DSP access after a burst read or write is complete, and the /Sn input is high, or after a pre-defined number of clock cycles without memory activity. Because other pages may still be open, however, it is possible that the host controller may incur several waits during a same page access. After the point of memory eligibility, the host controller must drive /Sn low and monitor the wait signal before issuing any new commands. The ACTV, WRITE or READ commands can then be asserted in the cycle following the cycle where /MWAITn is sampled as high. See FIG. 17.

Option 3: The memory is eligible for DSP access at any time. This option would allow the DSP to break pages, accessing the memory whenever the host controller is not currently busy with a memory transaction. The memory will be eligible for DSP access after any burst read or write is complete, and the /Sn input is high, or after a pre-defined number of clock cycles without memory activity. The DSP, after gaining access to the memory would be responsible for issuing a precharge for all banks that it wishes to access via a PALL or one or more PRE command(s). After precharging is complete, the DSP may issue an ACTV command for its desired row. After the point of memory eligibility, the host controller must drive /Sn low and monitor the wait signal before issuing any new commands. If /MWAITn is sampled to be low, then the controller must re-open the page with a new ACTV command. See FIG. 18.

At the end of a non-interrupted DSP access, the DSP has two options:
  a) The DSP precharges its accessed banks and re-opens the distrusted pages (via an ACTV command) and drives the /MWAITn signal back high. (This of course would require the DSP to register the last host controller page address.)
  b) The DSP precharges its accessed banks and continues to drive the /MWAITn signal low, indicating to the controller that any desired page(s) must be re-opened via an ACTV command.

Memory Controller Setup Registers

It may be helpful to add n register bits to the memory controller to pre-define which of n banks will drive the /MWAITn signal. Access to memory banks that do not drive the /MWAITn signal need not suffer the possible controller latency associated with sampling the /MWAITn signal for each memory access.

Implementation of IREQ and Wait Signals Option 2: One Global Wait Signal for all DIMMS, and One Interrupt Signal for Each Bank DIMM Impact This option shall add 3 signals to each DIMM module 98, /MWAIT signal 105, MIRQ0 signal 103, and /MIRQ1 signal 104.

See the block diagram in FIG. 19.

Memory Controller Impact

The memory controller shall have one /MIRQn signal (103 or 104) added for each of n banks. The memory controller shall have one and only one /MWAIT signal (105) added. Thus (1+n) extra pins are needed where n is the total number of memory banks.

The memory controller shall include the necessary logic to comprehend the added signals above.

The memory controller shall include setup registers (if needed).

See the block diagram in FIG. 19.

Signal List and Description

TABLE X

Signal List and Description (EDO/FPM DRAM)

Figure 20:
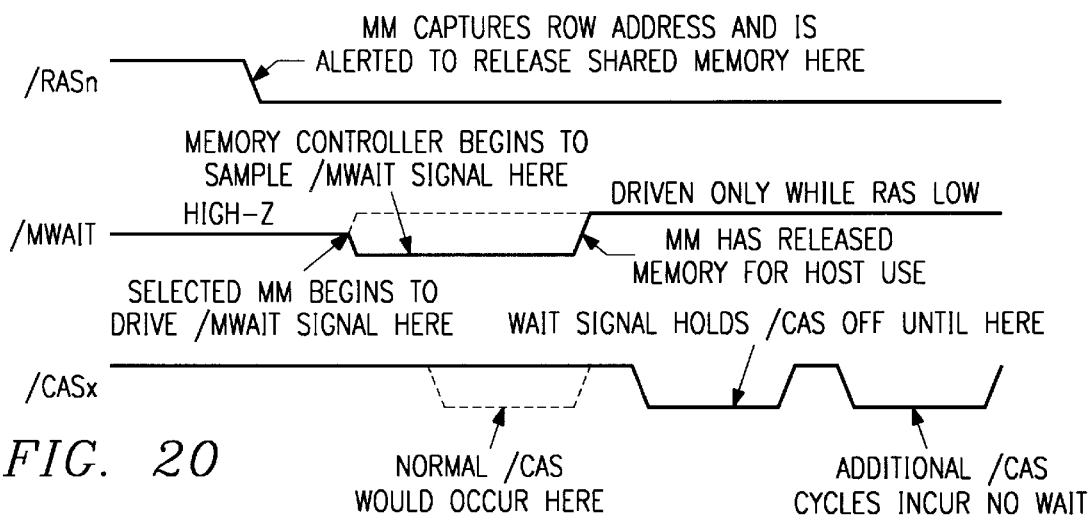
FIG. 20 illustrates the timing for the WAIT signal for FPM or EDO DRAM as discussed in "IMPLEMENTATION OF IREQ AND WAIT SIGNALS: OPTION 2"

/MWAIT: Memory WAIT flag for all DIMMs. This is an active-low signal driven by the currently accessed MM indicating that the accessed bank of DRAM is temporarily busy. The memory controller must begin to sample this signal directly after each falling edge of /RASn to determine if bank "n" currently accessed is busy. If the currently accessed bank is busy, then the memory controller must wait a short amount of time until this flag is driven back high indicating that the MM has relinquished the shared memory back to the controller. At this point, the controller may assert /CAS. The MM may only begin to use the shared memory when /RASn is high, thus further accesses to the same page of this bank will incur no wait. If all /RASn signals to the MM are high, then the MM shall tristate the /MWAIT signal. For compatibility with MMs that do not drive this signal, it shall be pulled up on the host PCB or in the host controller. See FIG. 20 for signal timing.
/MIRQ0: Memory Interrupt ReQuest for DIMM Bank 0. This is a signal indicating that this bank is requesting an interrupt of the host. A falling edge on this signal indicates an interrupt request. For compatibility with MMs that do not drive this signal, it shall be pulled up on the host PCB or in the host controller.
/MIRQ1: Memory Interrupt ReQuest for DIMM Bank 1. This is a signal indicating that this bank is requesting an interrupt of the host. A falling edge on this signal indicates an interrupt request. For compatibility with MMs that do not drive this signal, it shall be pulled up on the host PCB or in the host controller.

TABLE XI

Signal List and Description (DDR-S/SDRAM)

Figure 21:
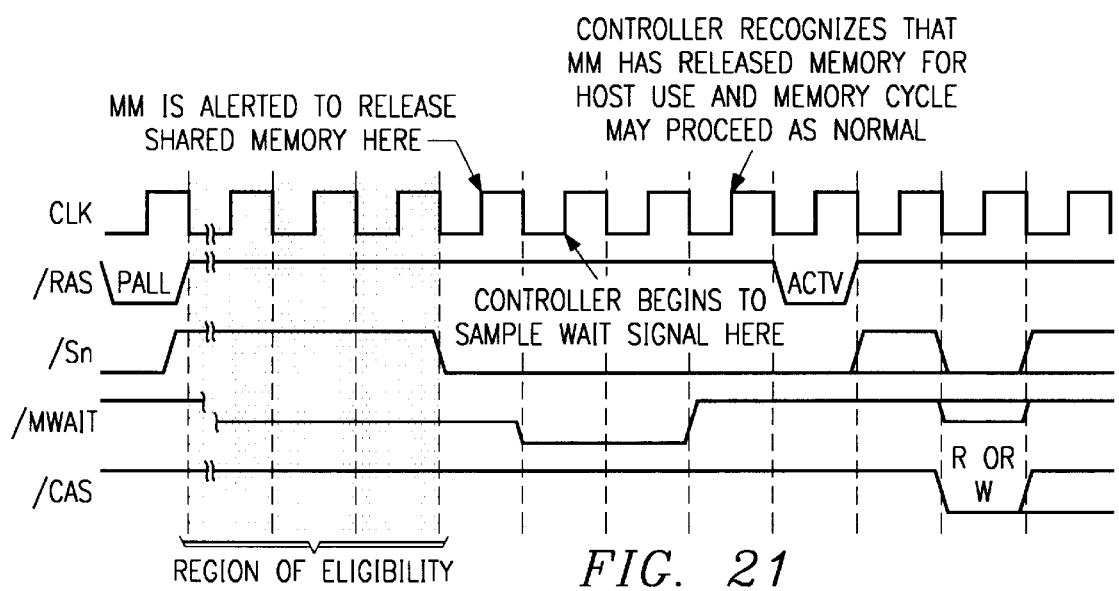
FIG. 21 illustrates the timing for the WAIT signal for DDR-S/S DRAM, eligibility option 1, as discussed in "IMPLEMENTATION OF IREQ AND WAIT SIGNALS: OPTION 2"
Figure 22:
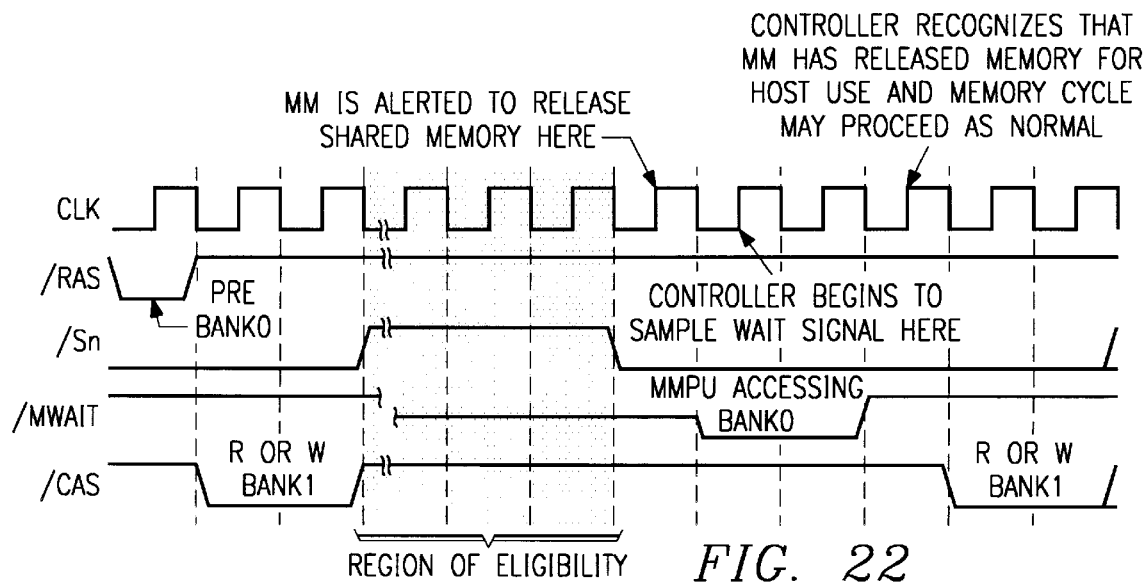
FIG. 22 illustrates the timing for the WAIT signal for DDR-S/S DRAM, eligibility option 2, as discussed in "IMPLEMENTATION OF IREQ AND WAIT SIGNALS: OPTION 2"
Figure 23:
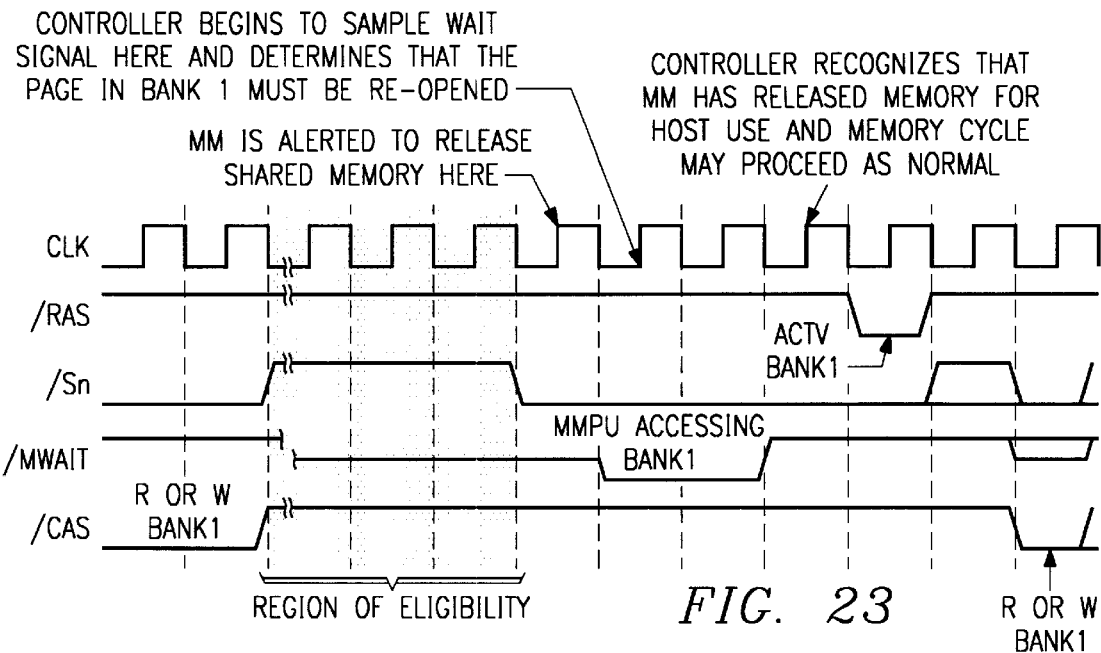
FIG. 23 illustrates the timing for the WAIT signal for DDR-S/S DRAM, eligibility option 3, as discussed in "IMPLEMENTATION OF IREQ AND WAIT SIGNALS: OPTION 2"

/MWAIT: Memory WAIT flag for all DIMMs. This is an active-low signal synchronous with the memory bus clock. It is driven only by the currently accessed MM to the memory controller indicating that this bank of SDRAM is temporarily busy. A bank "n" of SDRAM may only become busy when it is eligible for DSP access. A falling edge on the corresponding /Sn input will always end the period of eligibility, requesting host access of the memory. The memory controller must begin to sample the /MWAIT signal in the cycle following the falling edge of /Sn. If /MWAIT is sampled as low, then /MWAIT will be driven high shortly after this point, indicating that the MM has relinquished the shared memory back to the controller. At this point, the controller may continue (or begin) a memory cycle with no further delay. See the "eligibility" section and FIGS. 21–23. If all /Sn inputs are high, the module shall tristate the /MWAIT signal. For compatibility with MMs that do not drive this signal, it shall be pulled up on the host PCB or in the host controller.
/MIRQ0: Memory Interrupt ReQuest for DIMM Bank 0. This is a signal indicating that this bank is requesting an interrupt of the host. A falling edge on this signal indicates an interrupt request. For

TABLE XI-continued

Signal List and Description (DDR-S/SDRAM)

compatibility with MMs that do not drive this signal, it shall be pulled up on the host PCB or in the host controller.

/MIRQ1: Memory Interrupt ReQuest for DIMM Bank 1. This is a signal indicating that this bank is requesting an interrupt of the host. A falling edge on this signal indicates an interrupt request. For compatibility with MMs that do not drive this signal, it shall be pulled up on the host PCB or in the host controller.

Memory Eligibility for DSP Access (DDR-S/SDRAM Only)

Unlike conventional DRAMs, synchronous DRAMS have 2 or 4 internal banks. Because of this feature, the memory controller has the ability to open 2 or 4 pages at a time and instantly switch between them for read and write access. This feature makes the eligibility of DSP access to the memory slightly more complicated than with conventional DRAMs. A set of rules for eligibility must be defined.

Option 1: The shared SDRAM is only eligible for DSP access when all pages are known to be closed (after a PALL command). This will ensure that there are no page conflicts between the host and the DSP. After the point of memory eligibility, the host controller must drive /Sn low and monitor the wait signal before issuing any new commands. The ACTV command can then be asserted in the cycle following the cycle where /MWAIT is sampled as high. This option would work most efficiently if the host controller closed all pages at the end of every memory access. This option treats the SDRAM much like a (single bank) standard DRAM. See FIG. 21.

Option 2: The memory is eligible for DSP access on a bank-by-bank basis after the host controller executes a READA, WRITEA, or PRE command for the specific bank that the DSP wishes to access. This approach is slightly less straightforward and would require the DSP to monitor the bank that the host controller is currently accessing. Also, the DSP may not gain access to the memory directly after one of these three commands, for the host controller may choose to immediately execute a WRITE or READ command on a different internal bank. When the desired bank is known to be precharged, the memory is eligible for DSP access after a burst read or write is complete, and the /Sn input is high, or after a pre-defined number of clock cycles without memory activity. Because other pages may still be open, however, it is possible that the host controller may incur several waits during a same page access. After the point of memory eligibility, the host controller must drive /Sn low and monitor the wait signal before issuing any new commands. The ACTV, WRITE or READ commands can then be asserted in the cycle following the cycle where /MWAIT is sampled as high. See FIG. 22.

Option 3: The memory is eligible for DSP access at any time. This option would allow the DSP to break pages, accessing the memory whenever the host controller is not currently busy with a memory transaction. The memory will be eligible for DSP access after any burst read or write is complete, and the /Sn input is high, or after a pre-defined number of clock cycles without memory activity. The DSP, after gaining access to the memory would be responsible for issuing a precharge for all banks that it wishes to access via a PALL or one or more PRE command(s). After precharging is complete, the DSP may issue an ACTV command for its desired row. After the point of memory eligibility, the host controller must drive /Sn low and monitor the wait signal before issuing any new commands. If /MWAIT is sampled to be low, then the controller must re-open the page with a new ACTV command. See FIG. 23.

At the end of a non-interrupted DSP access, the DSP has two options:

a) The DSP precharges its accessed banks and re-opens the distrusted pages (via an ACTV command). The next time that /Sn is driven low, /MWAIT will respond as high. (This of course would require the DSP to register the last host controller page address.)

b) The DSP precharges its accessed banks. The next time that /Sn is driven low, /MWAIT will respond as low, indicating to the controller that any desired page(s) must be re-opened via an ACTV command.

Memory Controller Setup Registers

It may be helpful to add n register bits to the memory controller to pre-define which of n banks will drive the /MWAIT signal. Access to memory banks that do not drive the /MWAIT signal need not suffer the possible controller latency associated with sampling, the /MWAIT signal for each memory access.

Implementation of IREQ and Wait Signals Option 3: One Multiplexed Wait/Interrupt Signal for Each Bank Impact to DIMM This option shall add 2 signals to each DIMM module 98, /M0WAIT/IRQ signal 107, and /M1WAIT/IRQ signal 108.

Figure 24:
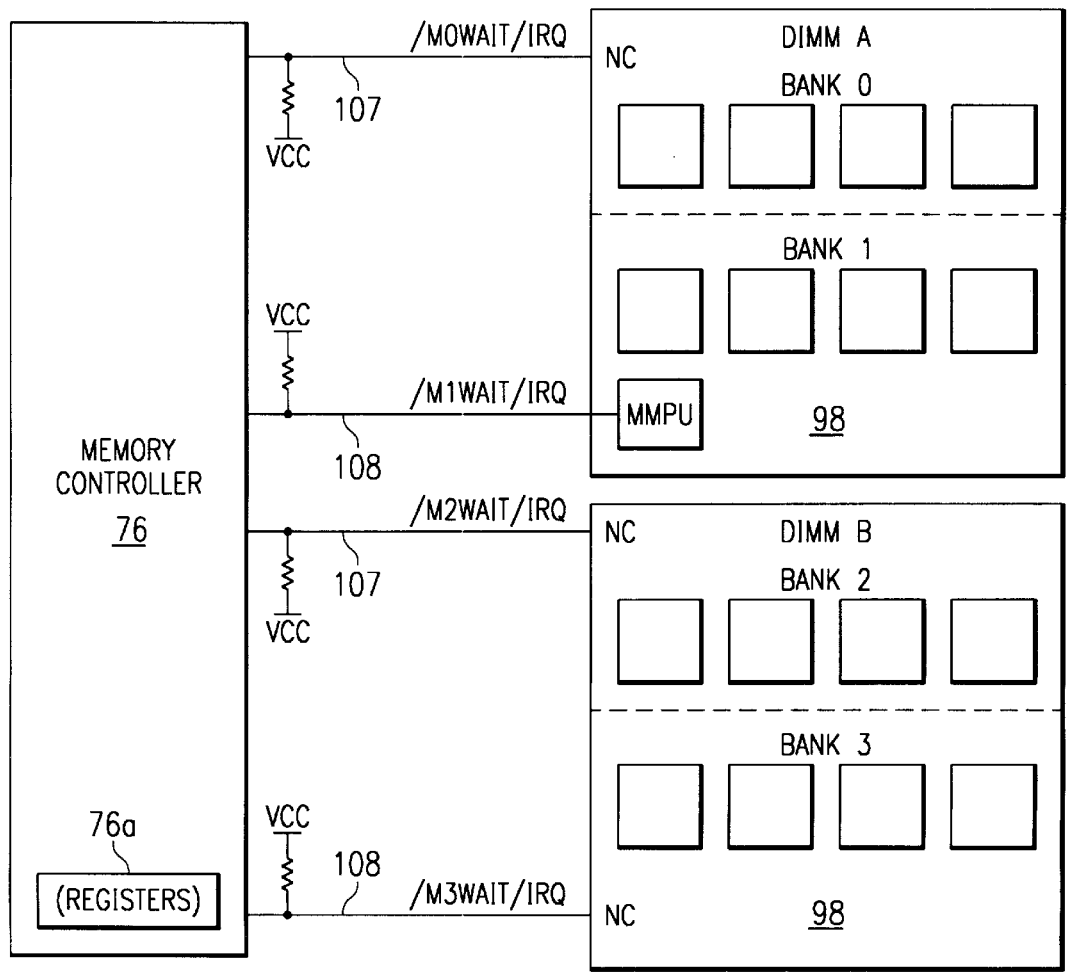
FIG. 24 illustrates the memory module(s) to host controller block diagram as discussed in "IMPLEMENTATION OF IREQ AND WAIT SIGNALS: OPTION 3"

See the block diagram in FIG. 24.

Impact to Memory Controller

The memory controller shall have one MnWAIT/IRQ signal (107 or 108) added for each of n banks. Thus n extra pins are needed where n is the total number of memory banks.

The memory controller shall include necessary logic to comprehend the added signals above.

The memory controller shall include setup registers (if needed).

See the block diagram in FIG. 24.

Signal List and Description

TABLE XII

Signal List and Description (FPM/EDO DRAM)

Figure 25:
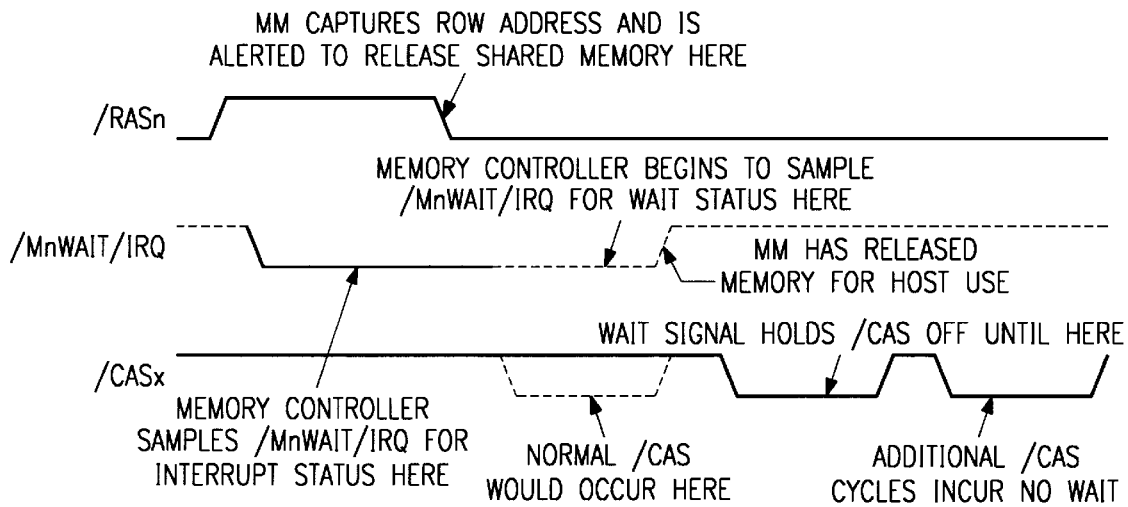
FIG. 25 illustrates the timing for the WAIT and IREQ signals for FPM or EDO DRAM as discussed in "IMPLEMENTATION OF IREQ AND WAIT SIGNALS: OPTION 3"

/M0WAIT/IRQ: Memory WAIT flag/Interrupt ReQuest for DIMM bank 0. This is a signal driven by the MM indicating that this bank of DRAM is busy or wishes to interrupt the host. When /RAS0 is driven high to begin precharge of the memory, /M0WAIT/IRQ will respond with the interrupt status of the DSP located in bank 0. The interrupt status shall be sampled by the memory controller at a specific point after the rising edge of /RAS0. When /RAS0 is driven low to begin memory access, /M0WAIT/IRQ will respond with the wait status of the memory in bank 0. The wait status shall be sampled by the memory controller starting at a specific point after the falling edge of /RAS0. /CAS may then be asserted after /M0WAIT/IRQ is driven high. For compatibility with MMs that do not drive this signal, it shall be pulled up on the host PCB or in the host controller. See FIG. 25 for signal timing.

/M1WAIT/IRQ: Memory WAIT flag/Interrupt ReQuest for DIMM bank 1. This is a signal driven by the MM indicating that this bank of DRAM is busy or wishes to interrupt the host. When /RAS1 is driven high to begin precharge of the memory, /M1WAIT/IRQ will respond with the interrupt status of the DSP located in bank 1. The interrupt status shall be sampled by the memory controller at a specific point after the rising edge of /RAS1. When /RAS1 is driven low to begin memory access, /M1WAIT/IRQ will respond with the wait status of the memory in bank 1. The wait status shall be sampled by the memory controller starting at a specific point after the falling edge of /RAS1. /CAS may then be asserted after /M1WAIT/IRQ is driven high. For compatibility with MMs that do not drive this signal, it shall be pulled up on the host PCB or in the host controller. See FIG. 25 for signal timing.

TABLE XIII

Signal List and Description (DDR-S/SDRAM)

Figure 26:
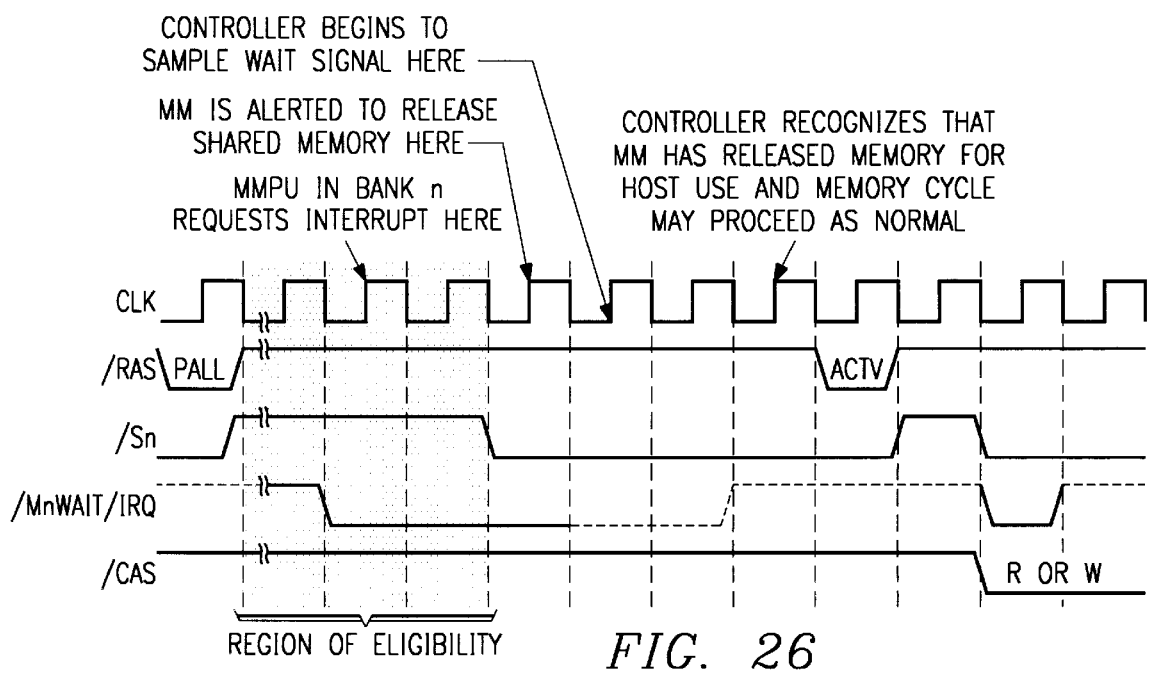
FIG. 26 illustrates the timing for the WAIT and IREQ signals for DDR-S/S DRAM, eligibility option 1, as discussed in "IMPLEMENTATION OF IREQ AND WAIT SIGNALS: OPTION 3"
Figure 27:
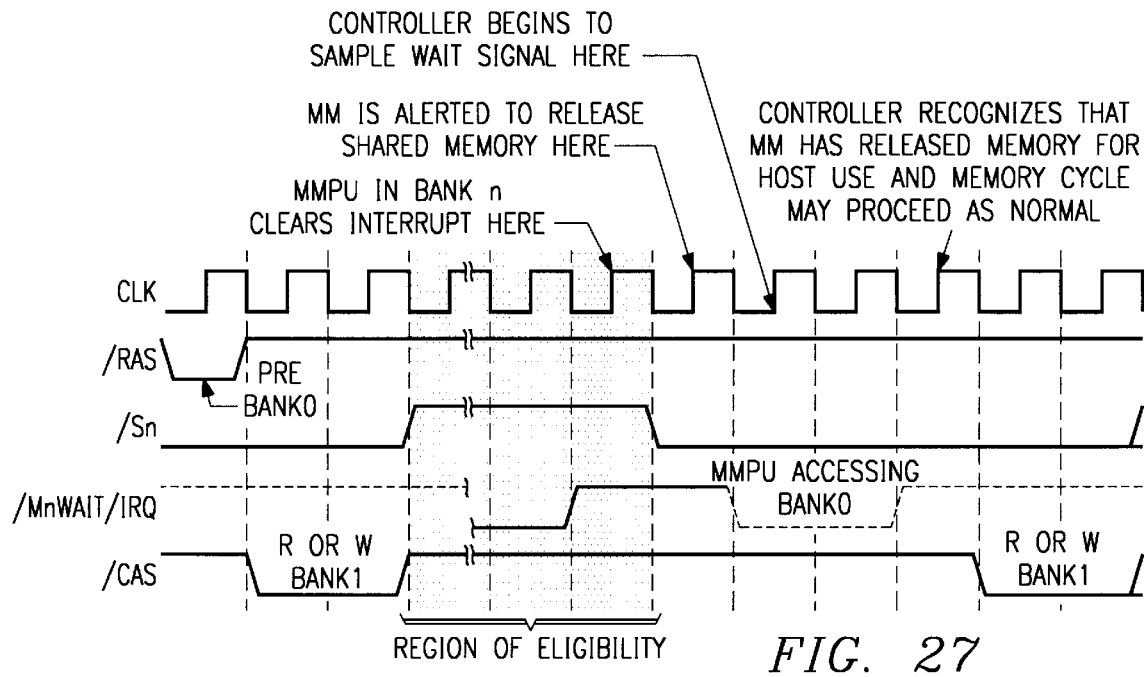
FIG. 27 illustrates the timing for the WAIT and IREQ signals for DDR-S/S DRAM, eligibility option 2, as discussed in "IMPLEMENTATION OF IREQ AND WAIT SIGNALS: OPTION 3"
Figure 28:
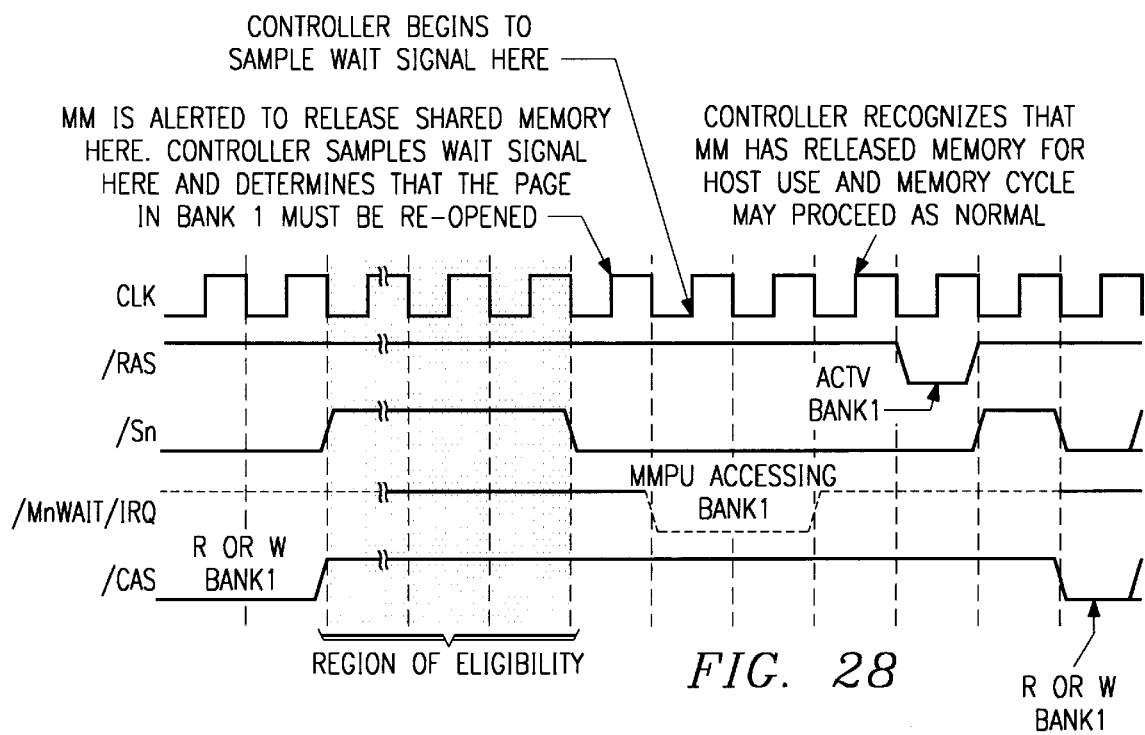
FIG. 28 illustrates the timing for the WAIT and IREQ signals for DDR-S/S DRAM, eligibility option 3, as discussed in "IMPLEMENTATION OF IREQ AND WAIT SIGNALS: OPTION 3"

/M0WAIT/IRQ: Memory WAIT flag/Interrupt ReQuest for DIMM bank 0 This is a signal driven by the MM indicating that this bank of SDRAM is busy or wishes to interrupt the host. This signal is synchronous with the memory bus clock. If /S0 is low, then the /M0WAIT/IRQ signal will convey the wait status in the next cycle. If /S0 is high, then the /M0WAIT/IRQ signal will convey the interrupt status in the next cycle. This bank of SDRAM may only become busy when it is eligible for DSP access. A falling edge on the /S0 input will always end the period of eligibility, requesting host access of the memory. If /M0WAIT/IRQ is sampled as low after /S0 goes low, then /M0WAIT/IRQ will be driven high shortly after this point, indicating that the MM has relinquished the shared memory back to the controller. At this point, the controller may continue (or begin) a memory cycle with no further delay. See the "eligibility" section and FIGS. 26–28. For compatibility with MMs that do not drive this signal, it shall be pulled up on the host PCB or in the host controller.

/M1WAIT/IRQ: Memory WAIT flag/Interrupt ReQuest for DIMM bank 1. This is a signal driven by the MM indicating that this bank of SDRAM is busy or wishes to interrupt the host. This signal is synchronous with the memory bus clock, If /S1 is low, then the /M1WAIT/IRQ signal will convey the wait status in the next cycle. If /S1 is high, then the /M1WAIT/IRQ signal will convey the interrupt status in the next cycle. This bank of SDRAM may only become busy when it is eligible for DSP access. A falling edge on the /S1 input will always end the period of eligibility, requesting host access of the memory. If /M1WAIT/IRQ is sampled as low after /S1 goes low, then /M1WAIT/IRQ will be driven high shortly after this point, indicating that the MM has relinquished the shared memory back to the controller. At this point, the controller may continue (or begin) a memory cycle with no further delay. See the "eligibility" section and FIGS. 26–28. For compatibility with MMs that do not drive this signal, it shall be pulled up on the host PCB or in the host controller.

Memory Eligibility for DSP Access (DDR-S/SDRAM Only)

Unlike conventional DRAMs, synchronous DRAMS have 2 or 4 internal banks. Because of this feature, the memory controller has the ability to open 2 or 4 pages at a time and instantly switch between them for read and write access. This feature makes the eligibility of DSP access to the memory slightly more complicated than with conventional DRAMs. A set of rules for eligibility must be defined.

Option 1: The shared SDRAM is only eligible for DSP access when all pages are known to be closed (after a PALL command). This will ensure that there are no page conflicts between the host and the DSP. After the point of memory eligibility, the host controller must drive /Sn low and monitor the wait signal before issuing any new commands. The ACTV command can then be asserted in the cycle following the cycle where /MnWAIT/IRQ is sampled as high. This option would work most efficiently if the host controller closed all pages at the end of every memory access. This option treats the SDRAM much like a (single bank) standard DRAM. See FIG. 26.

Option 2: The memory is eligible for DSP access on a bank-by-bank basis after the host controller executes a READA, WRITEA, or PRE command for the specific bank that the DSP wishes to access. This approach is slightly less straightforward and would require the DSP to monitor the bank that the host controller is currently accessing. Also, the DSP may not gain access to the memory directly after one of these three commands, for the host controller may choose to immediately execute a WRITE or READ command on a different internal bank. When the desired bank is known to be precharged, the memory is eligible for DSP access after a burst read or write is complete, and the /Sn input is high, or after a pre-defined number of clock cycles without memory activity. Because other pages may still be open, however, it is possible that the host controller may incur several waits during a same page access. After the point of memory eligibility, the host controller must drive /Sn low and monitor the wait signal before issuing any new commands. The ACTV, WRITE or READ commands can then be asserted in the cycle following the cycle where /MnWAIT/IRQ is sampled as high. See FIG. 27.

Option 3: The memory is eligible for DSP access at any time. This option would allow the DSP to break pages, accessing the memory whenever the host controller is not currently busy with a memory transaction. The memory will be eligible for DSP access after any burst read or write is complete, and the /Sn input is high, or after a pre-defined number of clock cycles without memory activity. The DSP, after gaining access to the memory would be responsible for issuing a precharge for all banks that it wishes to access via a PALL or one or more PRE command(s). After precharging is complete, the DSP may issue an ACTV command for its desired row. After the point of memory eligibility, the host controller must drive /Sn low and monitor the wait signal before issuing any new commands. If /MnWAIT/IRQ is sampled to be low, then the controller must re-open the page with a new ACTV command. See FIG. 28.

At the end of a non-interrupted DSP access, the DSP has two options:
 a) The DSP precharges its accessed banks and re-opens the distrusted pages (via an ACTV command). The next time that /Sn is driven low, /MnWAIT/IRQ will respond as high. (This of course would require the DSP to register the last host controller page address.)
 b) The DSP precharges its accessed banks. The next time that /Sn is driven low, /MnWAIT/IRQ will respond as low, indicating to the controller that any desired page(s) must be re-opened via an ACTV command.

Memory Controller Setup Registers

It may be helpful to add n register bits to the memory controller to pre-define which of n banks will drive the /MnWAIT/IRQ signal. Access to memory banks that do not drive the /MnWAIT/IRQ signal need not suffer the possible controller latency associated with sampling the /MnWAIT/IRQ signal for each memory access.

Implementation of IREQ and Wait Signals Option 4: No Wait Signal(s), One Interrupt Signal for Each Bank Impact to DIMM This option shall add 2 signals to each DIMM module 98, /MIRQ0 signal 103 and /MIRQ1 signal 104.

Figure 29:
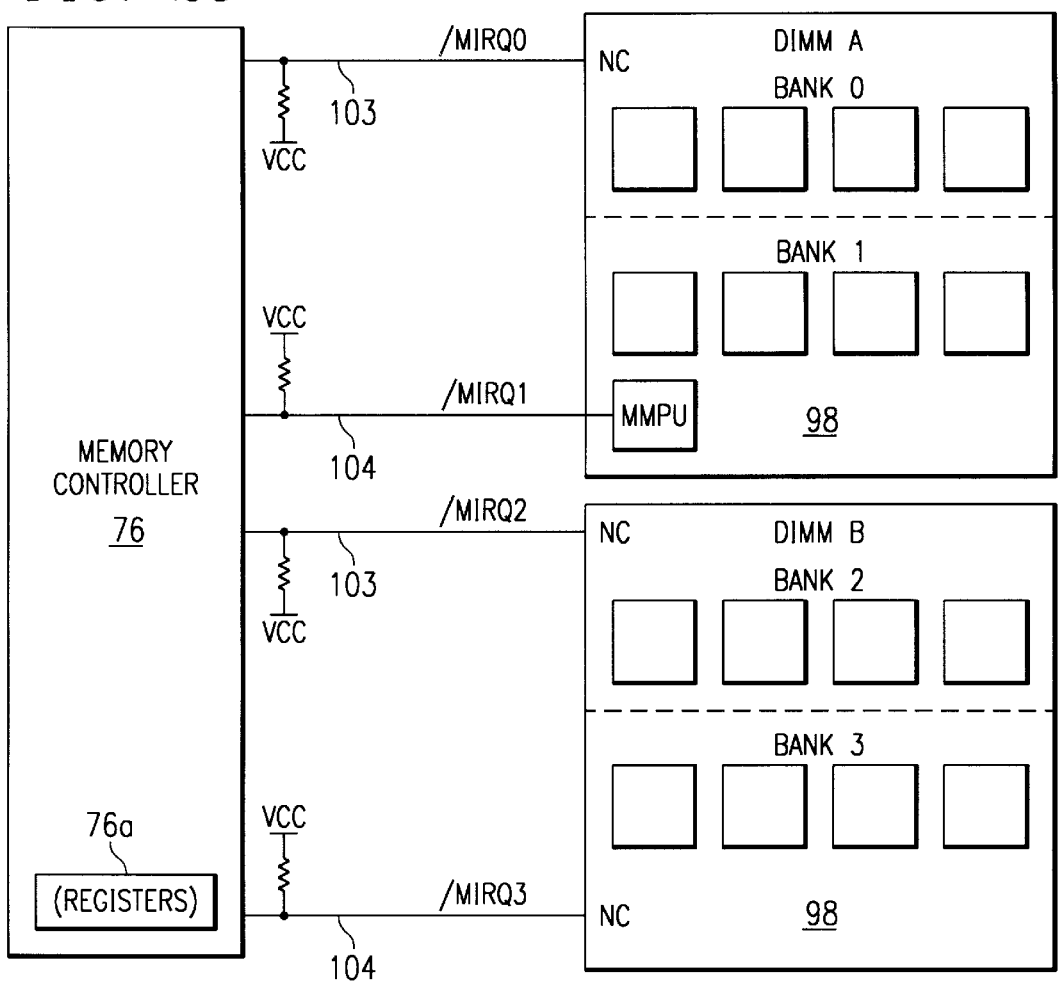
FIG. 29 illustrates the memory module(s) to host controller block diagram as discussed in "IMPLEMENTATION OF IREQ AND WAIT SIGNALS: OPTION 4"

See the block diagram in FIG. 29.

Impact to Memory Controller

The memory controller shall have one /MIRQn signal (103 or 104) added for each of n banks. The implementation of the wait function is described in the section 2.4.6 below. Thus n extra pins are needed where n is the total number of memory banks.

The memory controller shall include the necessary logic to comprehend the added signals above.

The memory controller shall include the appropriate setup registers and logic to implement the WAIT function.

See the block diagram in FIG. 29.

Signal List and Description

TABLE XIV

Signal List and Description

/MIRQ0: Memory Interrupt ReQuest for DIMM bank 0. This is a signal indicating that this bank is requesting an interrupt of the host. A falling edge on this signal indicates an interrupt request. For compatibility with MMs that do not drive this signal, it shall be pulled up on the host PCB or in the host controller.
/MIRQ1: Memory Interrupt ReQuest for DIMM bank 1. This is a signal indicating that this bank is requesting an interrupt of the host. A falling edge on this signal indicates an interrupt request. For compatibility with MMs that do not drive this signal, it shall be pulled up on the host PCB or in the host controller.

Memory Eligibility for DSP Access (DDR-S/SDRAM Only)

Unlike conventional DRAMs, synchronous DRAMS have 2 or 4 internal banks. Because of this feature, the memory controller has the ability to open 2 or 4 pages at a time and instantly switch between them for read and write access. This feature makes the eligibility of DSP access to the memory slightly more complicated than with conventional DRAMs. A set of rules for eligibility must be defined.

For this option, the shared SDRAM shall only be eligible for DSP access when all pages are known to be closed (after a PALL command). This greatly simplifies the memory controller design, making it easy for the controller to determine where the region of eligibility begins. This will ensure that there are no page conflicts between the host and the DSP. This option would work most efficiently if the host controller closed all pages at the end of every memory access. This option treats the SDRAM much like a (single bank) standard DRAM.

Memory Controller Setup Registers

When the MM is placed in "smart mode", a RAS-to-CAS delay of memory access is necessary because the (S)DRAM in the selected bank will be shared. In the case of FPM or EDO DRAM, RAS-to-CAS delay refers to the time from the falling edge of RAS to the falling edge of /CAS. When using SDRAM, RAS-to-CAS delay refers to the number of memory clock cycles between a ROW ACTIVE and READ or WRITE command. All other timing after the first falling edge of /CAS may proceed as normal.

In order to implement this delay (or wait) function, it is necessary to add n registers to the memory controller to pre-define the RAS-to-CAS wait time for each of n banks. Many controllers have this feature today, but only on a global (not bank-by-bank) basis. The controller must also be capable of extending the RAS-to-CAS delay to a value greater than the time required for the MM to release the shared memory back to the controller. Generally, this time shall be no less than $t_{RC}$ (read or write cycle time) for the particular DRAM used on the MM. Since in this option, there is no feedback from the MM to indicate when the memory is available, the RAS-to-CAS delay time must be set to a "safe" value greater than $t_{RC}+t_{MM\_BUS\_SWITCH}$, or the total time required to completely guarantee that the shared memory may be accessed by the memory controller.

Access to memory banks that are not pre-defined to need extended cycles shall be set at power-up to operate normally. Accesses to registers corresponding to banks with DSPs shall be done dynamically, not just at power-up. This will allow the wait length time to be changed "on the fly" when the MM is placed into and out of smart mode.

When the MM is not in the "Smart Mode," the selected bank of the MM shall operate normally, as standard DRAM.

Implementation of IREQ and Wait Signals Option 5: One Multiplexed & Vectorized Wait/Interrupt Signal for Each Module (DDR-S/SDRAM Only)

Impact to DIMM

This option shall add 1 signal to each DIMM module 98, /MWAIT/IRQ signal 109.

Figure 30:
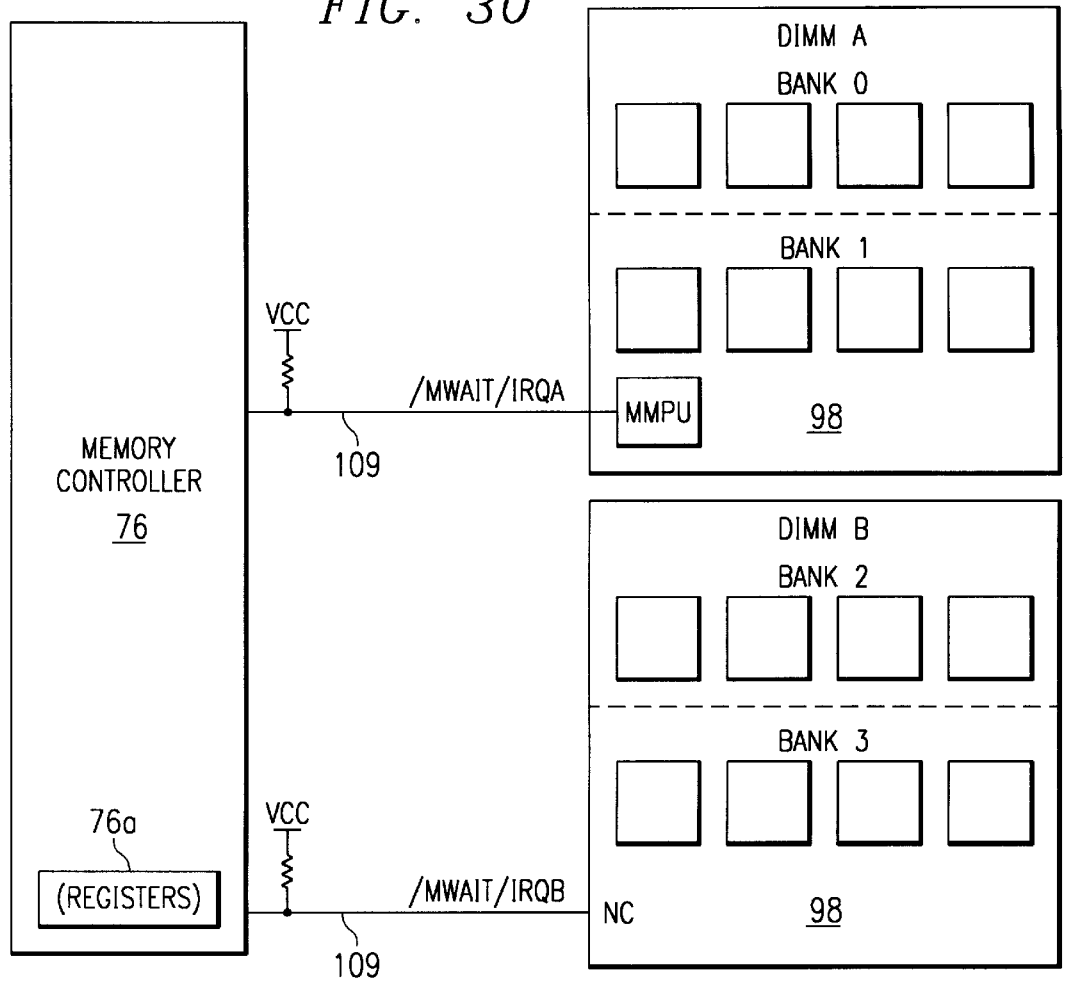
FIG. 30 illustrates the memory module(s) to host controller block diagram as discussed in "IMPLEMENTATION OF IREQ AND WAIT SIGNALS: OPTION 5"

See the block diagram in FIG. 30.

Impact to Memory Controller

The memory controller shall have one MWAIT/IRQ signal 109 added for each MM (containing 2 banks). Thus n/2 extra pins are needed where n is the total number of memory banks.

The memory controller shall include necessary logic to comprehend the added signals above.

The memory controller shall include setup registers (if needed).

See the block diagram in FIG. 30.

Figure 32:
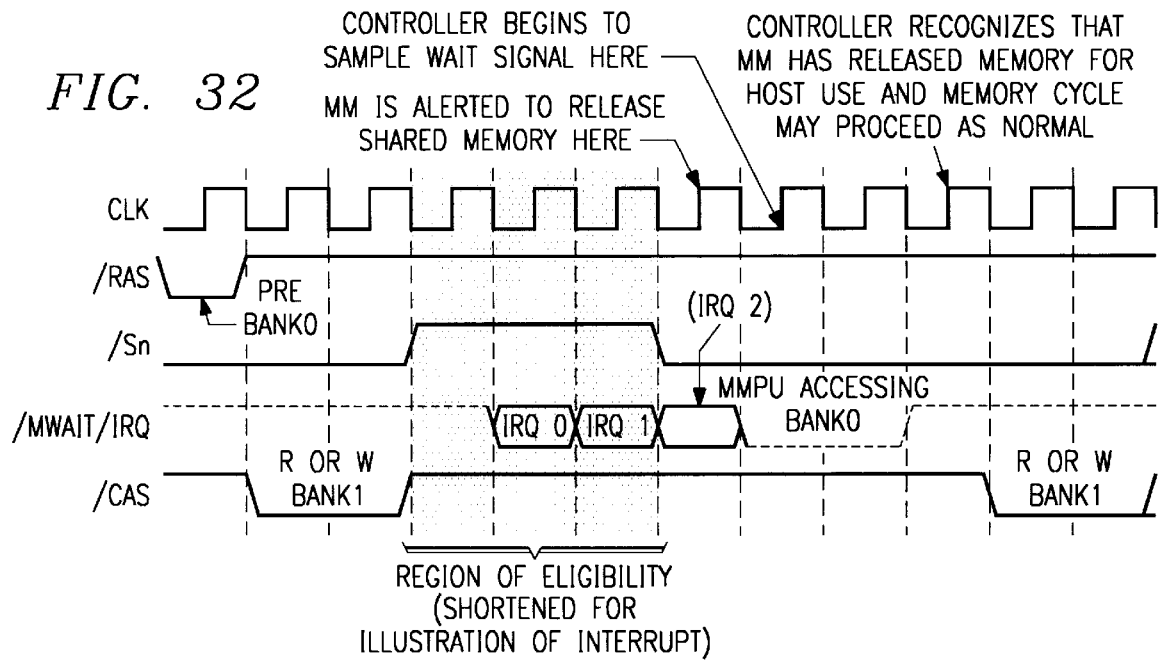
FIG. 32 illustrates the timing for the WAIT and IREQ signals for DDR-S/S DRAM, eligibility option 2, as discussed in "IMPLEMENTATION OF IREQ AND WAIT SIGNALS: OPTION 5"

Signal List and Description accessing. Also, the DSP may not gain access to the memory directly after one of these three commands, for the host controller may choose to immediately execute a WRITE or READ command on a different internal bank. When the desired bank is known to be precharged, the memory is eligible for DSP access after a burst read or write is complete, and the /Sn input is high, or after a pre-defined number of clock cycles without memory activity. Because other pages may still be open, however, it is possible that the host controller may incur several waits during a same page access. After the point of memory eligibility, the host controller must drive /Sn low and monitor the wait signal before issuing any new commands. The ACTV, WRITE or READ commands can then be asserted in the cycle following the cycle where /MWAIT/IRQ is sampled as high. See FIG. 32.

Option 3: The memory is eligible for DSP access at any time. This option would allow the DSP to break pages, accessing the memory whenever the host controller is not currently busy with a memory transaction. The memory will be eligible for DSP access after any burst read or write is complete, and the /Sn input is high, or after a pre-defined number of clock cycles without

TABLE XV

Signal List and Description

Figure 31:
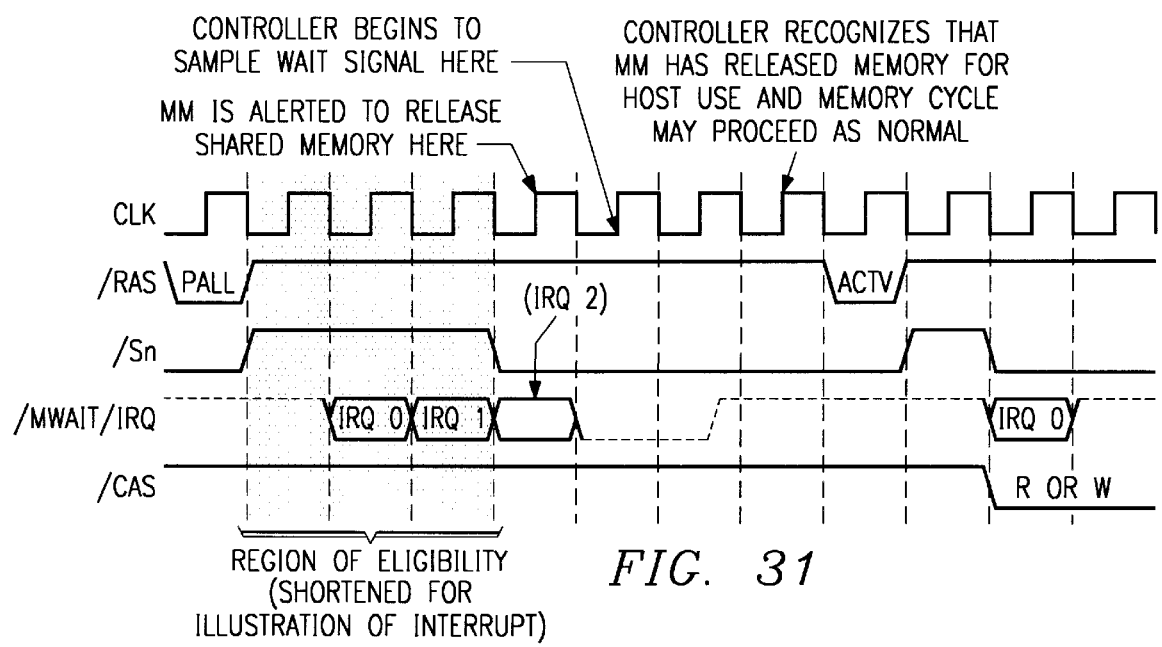
FIG. 31 illustrates the timing for the WAIT and IREQ signals for DDR-S/S DRAM, eligibility option 1, as discussed in "IMPLEMENTATION OF IREQ AND WAIT SIGNALS: OPTION 5"
Figure 33:
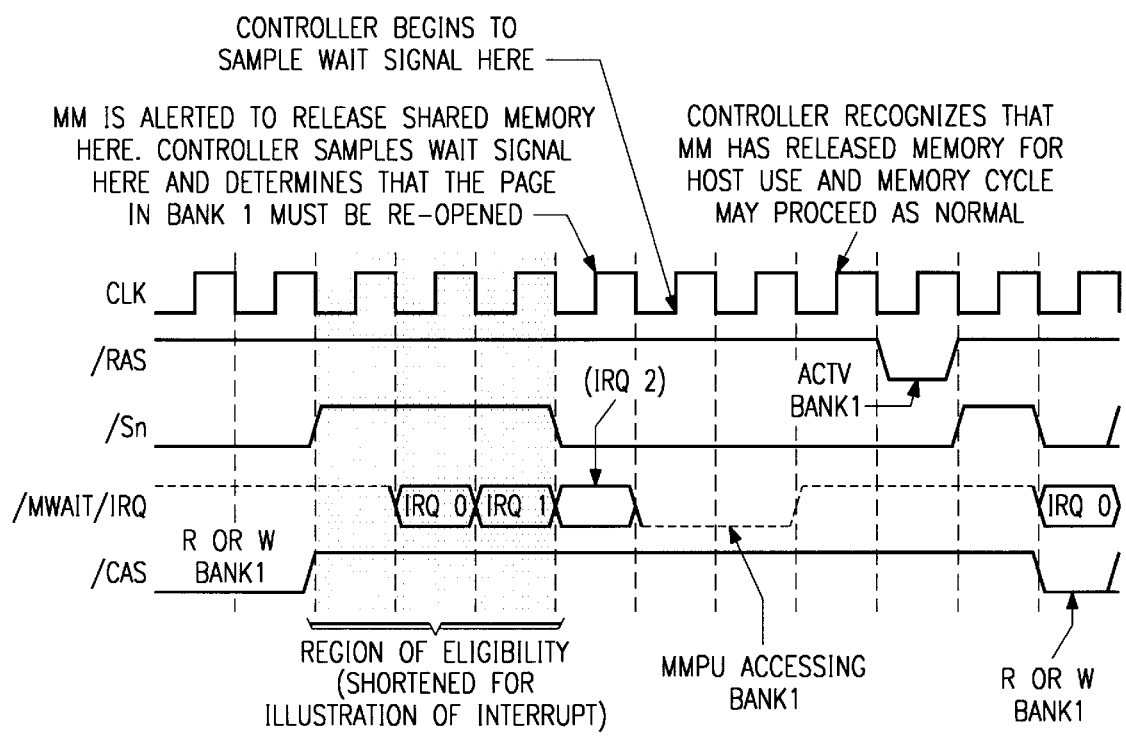
FIG. 33 illustrates the timing for the WAIT and IREQ signals for DDR-S/S DRAM, eligibility option 3, as discussed in "IMPLEMENTATION OF IREQ AND WAIT SIGNALS: OPTION 5"

/MWAIT/IRQ: Memory WAIT flag/Interrupt ReQuest for a particular DIMM. This is a signal driven by the MM indicating that the currently accessed bank of SDRAM is busy or that a specific DSP wishes to interrupt the host. This signal is synchronous with the memory bus clock. If an /Sn input is low, then the /MWAIT/IRQ signal will convey the wait status of bank "n" in the next cycle. If all /Sn inputs are driven high, then the /MWAIT/IRQ signal will begin to transmit the interrupt status vector starting in the next cycle. A bank of SDRAM may only become busy when it is eligible for DSP access. A falling edge on an /Sn input will always end the period of eligibility, abort the transmission of the interrupt status vector (if one is in progress), and request host access of the memory. If /MWAIT/IRQ is sampled as low after /Sn goes low, then /MWAIT/IRQ will be driven high shortly after this point, indicating that the MM has relinquished bank "n" of the shared memory back to the controller. At this point, the controller may continue (or begin) a memory cycle with no further delay. See the "eligibility" section and FIGS 31–33. For compatibility with MMs that do not drive this signal, it shall be pulled up on the host PCB or in the host controller.

Unlike conventional DRAMs, synchronous DRAMS have 2 or 4 internal banks. Because of this feature, the memory controller has the ability to open 2 or 4 pages at a time and instantly switch between them for read and write access. This feature makes the eligibility of DSP access to the memory slightly more complicated than with conventional DRAMs. A set of rules for eligibility must be defined.

Option 1: The shared SDRAM is only eligible for DSP access when all pages are known to be closed (after a PALL command). This will ensure that there are no page conflicts between the host and the DSP. After the point of memory eligibility, the host controller must drive /Sn low and monitor the wait signal before issuing any new commands. The ACTV command can then be asserted in the cycle following the cycle where /MWAIT/IRQ is sampled as high. This option would work most efficiently if the host controller closed all pages at the end of every memory access. This option treats the SDRAM much like a (single bank) standard DRAM. See FIG. 31.

Option 2: The memory is eligible for DSP access on a bank-by-bank basis after the host controller executes a READA, WRITEA, or PRE command for the specific bank that the DSP wishes to access. This approach is slightly less straightforward and would require the DSP to monitor the bank that the host controller is currently memory activity. The DSP, after gaining access to the memory would be responsible for issuing a precharge for all banks that it wishes to access via a PALL or one or more PRE command(s). After precharging is complete, the DSP may issue an ACTV command for its desired row. After the point of memory eligibility, the host controller must drive /Sn low and monitor the wait signal before issuing any new commands. If /MWAIT/IRQ is sampled to be low, then the controller must re-open the page with a new ACTV command. See FIG. 33.

At the end of a non-interrupted DSP access, the DSP has two options:

a) The DSP precharges its accessed banks and re-opens the distrusted pages (via an ACTV command). The next time that /Sn is driven low, /MWAIT/IRQ will respond as high. (This of course would require the DSP to register the last host controller page address.)

b) The DSP precharges its accessed banks. The next time that /Sn is driven low, /MWAIT will respond as low, indicating to the controller that any desired page(s) must be re-opened via an ACTV command.

Memory Controller Setup Registers

It may be helpful to add n register bits to the memory controller to pre-define which of n banks will drive the /MWAIT/IRQ signal. Access to memory banks that do not drive the /MWAIT/IRQ signal need not suffer the possible controller latency associated with sampling the /MWAIT/IRQ signal for each memory access.

Implementation of IREQ and Wait Signals Option 6: No New Signal(s), No Interrupt Lines, 1 Semaphore Bit Impact to DIMM
  None.
Impact to Memory Controller
  The memory controller shall include the necessary logic to implement the wait function by accessing the semaphore bit memory location before accessing any of the shared memory.
  The memory controller shall include setup registers to pre-define which bank(s) shall be populated with shared memory.
Signal List and Description
  No extra signals are required.
Block Diagram
  DIMM and Memory Controller pinouts remain the same.
Memory Controller Setup Registers
  In order to implement the wait function, it is necessary to add n bits of registers to the memory controller to pre-define which banks shall contain shared memory.

Implementation of IREQ and Wait Signals Miscellaneous Topics

SSTL vs. TTL
  Since all wait and interrupt signals proposed above use only the rising edge of the system memory clock (DDR-S/SDRAM case), they shall be implemented with standard TTL or LVTTL.
Refresh Handling
  While in smart mode, refresh can be handled 1 of 2 ways:

implemented. The controller must wait until the MM relinquishes the memory to complete the refresh operation.

Figure 34:
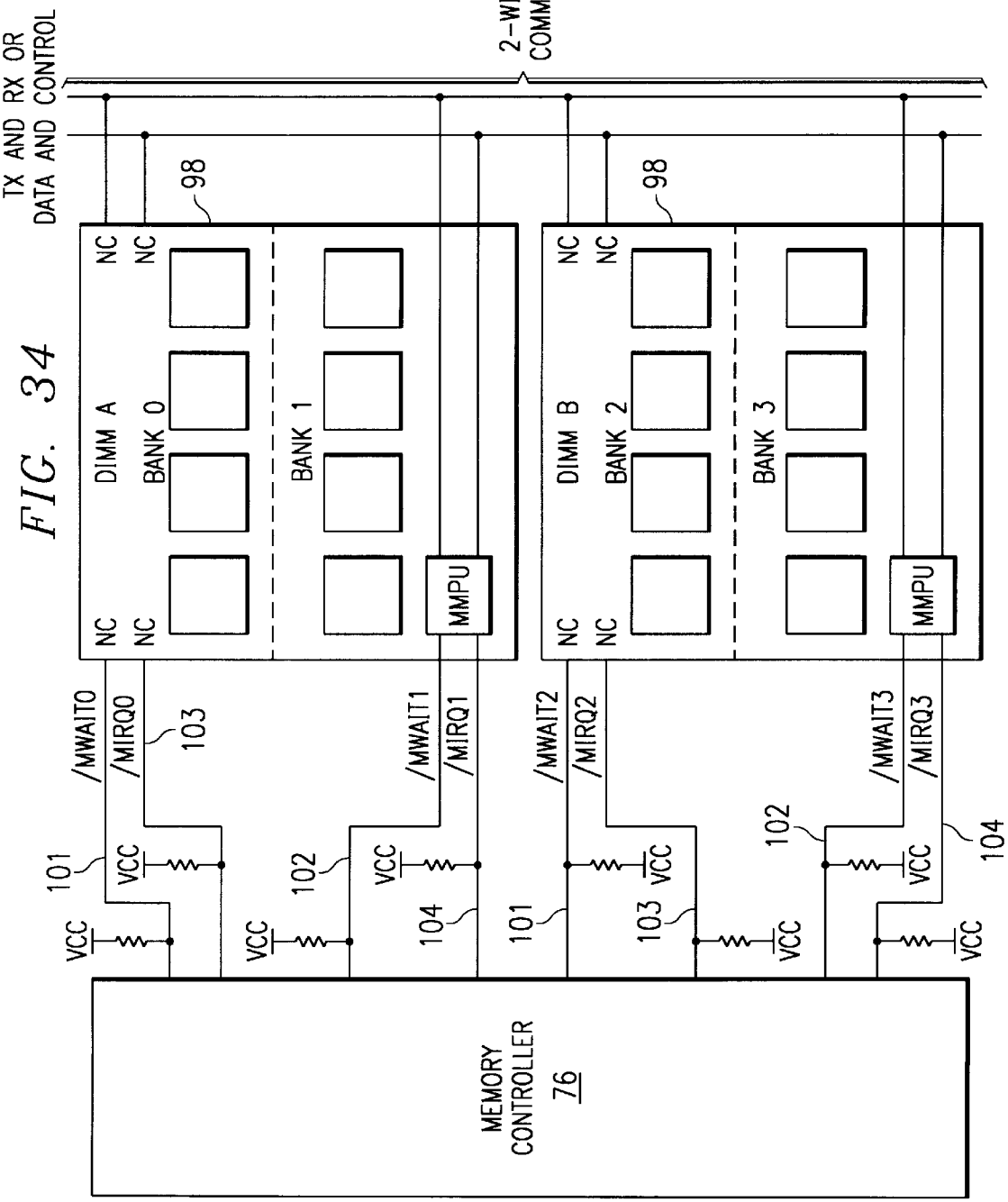
FIG. 34 illustrates a possible solution for module-to-module communication via a 2 wire bus.

Memory Bus Capacitance/Memory Access Time
  With the high speed of today's DRAMs and SDRAMs, and the promise of even higher speed for DDR-SDRAMS for tomorrow, bus loading must be considered very carefully in MM design. The memory access time, $t_{ac}$, is also a very important parameter which cannot be violated.
  For bus isolation on the Basava Memory Module, bus switches (crossbars) shall be used. This allows switchable connection to the PC's memory bus while only introducing a maximum of 0.25 ns propagation delay. Switches of this type add anywhere from 4 to 8 pF of capacitance to the lines that they are connected to, so it will be important that the design of the MM is properly within specification for the driving logic.
Module-to-Module Communication
  If multiple MMs containing DSPs are placed in one system, it may be advantageous that the DSPs be able to communicate with one another. It is not necessary that motherboard connection pins be allocated on the DIMM module for this purpose, for a separate connector may be defined for this purpose.
  The interface bus shall consist of 2 or 3 wires. A protocol shall be defined that allows all DSPs to communicate with one another without having to define a master/slave relationship. Actual details on this concept will soon be defined. FIG. 34 shows this concept.

Implementation of IREQ and Wait Signals Conclusion

The following table summarizes the five options above.

TABLE XVI

Implementation Option Comparison

| | Option 1 | Option 2 | Option 3 | Option 4 | Option 5 | Option 6 |
|---|---|---|---|---|---|---|
| Interrupt Function | 1 SIGNAL PER BANK | 1 SIGNAL PER BANK | 1 SIGNAL PER BANK | 1 SIGNAL PER BANK | 1 SIGNAL PER MODULE | NONE |
| Wait Function | 1 SIGNAL PER BANK | 1 GLOBAL SIGNAL | MULTIPLEXED WAIT & INT | CONTROLLER REGISTERS | MULTIPLEX'D VECTORIZED | SEMAPHORE BIT |
| New pins required on DIMM | 4 | 3 | 2 | 2 | 1 | — |
| New pins required on Controller | 2n | 1 + n | n | n | n/2 | — |
| Comment | High pin count | Most versatile | Somewhat complicated protocol | Easy implementation, but only 1 SDRAM eligibility option | Super-low pin count, but supports SDRAM only (requires clock for vector) | No extra pins required. Poor performance. |
| Editor's Preference | 2 | 1 | 3 | 5 | 4 | 6 | n = total number of memory banks. Memory Modules are assumed to have 2 banks.

Option 1: When the memory controller requests a CBR (or /RAS only for EDO & FPM DRAMs) refresh, the MM shall detect this command and execute it immediately (if not busy), or "buffer up" the refresh commands and execute them at a later time when the DSP is not accessing the memory.

Option 2: When the memory controller requests a refresh, and the DSP is accessing the shared memory, the same wait protocol defined in the options above shall be Although Option 1 is by far the easiest for the MM design, it carries a high DIMM and Memory Controller pinout.

Option 2 is the best trade-off between versatility and pins, allowing full feedback from the MM for the wait function, while only using 1+n controller pins.

Option 3 cuts the DIMM pin and controller pin by one, but requires a complicated protocol. Option 4 is far easier to implement and boasts the same low pinout as Option 3.

Option 4, however limits the DSP's accessibility to SDRAM.

Option 5 shall be used if pins on the MM are in short supply. Option 5 supports SDRAM or DDR-SDRAM operation only.

Option 6 shall only be used as a last resort if no pins are available for use on the DIMM.

Implementation Examples

Figure 12:
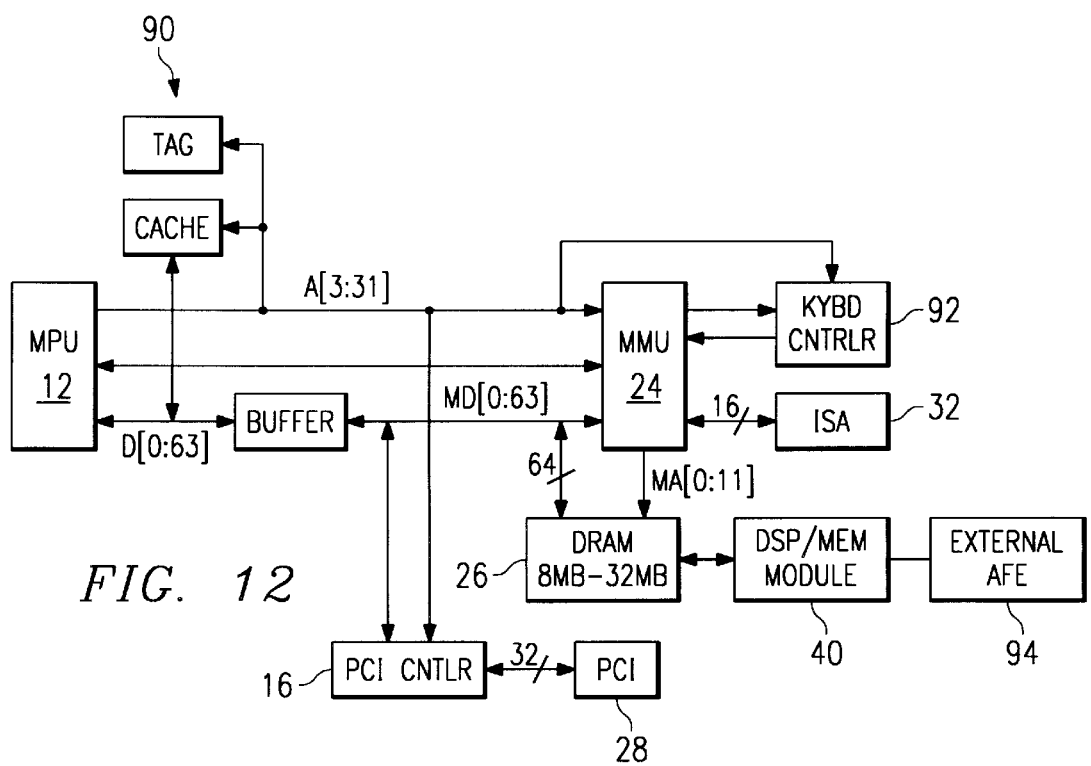
FIG. 12 illustrates a DSP/memory module in a computer system using an analog front end directly connected to the module.

FIG. 12 illustrates the DSP/memory module 40 in a typical computer architecture. In addition to the elements shown in FIG. 1, a secondary cache 90, keyboard controller 92 and external AFE (Analog Front End) are shown. The analog front end may be used to connect to the CODEC 84 on the DSP/memory module 40 to receive external data, such as voice data or video data. Typical memory expansion modules 26 have only one connector for the memory bus 24. However, in this case, in order to support direct access to external devices by the DSP 56, an AFE 94 is provided. The AFE 94 could connect to connectors on the other side of the substrate 46 (see FIG. 2) to make connection with the DSP and communicate using direct memory access, while maintaining compatibility with standard SIMMs. This AFE supports sound, modem, wireless applications.

The DSP/memory module 40 can be used in many application to increase the speed of multimedia features and reduce the load on the MPU 12. In a first example, modem information could come from a telephone line to the CODEC 84. Using the local SRAM 58, the DSP 56 could translate the data and place it in the shared memory 54. The MPU 12 would then retrieve the translated data from the shared memory 54. This is an example of an application which would otherwise require many instruction cycles of the MPU 12, but can be accomplished with very little MPU interaction using the DSP/memory module 40.

In a second example, the MPU 12 could open a file on a DVD (digital versatile disk) which has compressed audio or video. The MPU 12 would pass the data directly to the shared memory 54 and instruct the DSP 56 to decompress the data. As the data was decompressed, it would be returned to the shared memory, where the MPU 12 would retrieve the decompressed data and pass the data to the frame buffer of the video/graphics card for display. This is an example of an application which would require excessive bandwidth if the data had to be passes over the ISA bus 32 or PCI bus 28, but can be accomplished at high speed using the faster memory bus 24 and the DSP/memory module 40.

A third example uses the DSP/memory module 40 to perform wavetable synthesis. In this example, the shared memory 54 can be used to store the wavetable sounds, which normally require a large memory. The DSP 56 can use the wavetable data to perform the synthesis. Normally, a separate card would be required, along with its own memory for storing the wavetable data (typically on the order of two to four megabytes). Thus, the DSP/memory module 40 saves system costs by using the main memory to perform wavetable synthesis.

FIG. 13 illustrates a variation of the computer system of FIG. 12 wherein an AFE card 96 is connected to the PCI bus 28. The AFE card 96 would include the CODEC and would provide connections to external analog sources such as a line-in/out, microphone input, telephone line or cellular connection. In this implementation, the AFE card 96 can send data directly to the DSP/memory module 40, since the PCI bus has bus mastering capability, whereas the ISA bus does not. Similarly, the AFE card 96 could be connected to any bus which has the ability to write directly to the main memory.

In addition to providing connections to an external analog source, the AFE card 96 could poll a status register on the DSP/memory module 40 (if polling was necessary to determine whether a task had been completed by the DSP/memory module 40) at fairly high speeds. With current day processors, it is estimated that polling should be performed at intervals on the order of 20 milliseconds for optimum performance. A card in the PCI bus could poll the DSP/memory module 40 at greater speed, on the order of five milliseconds or less without degradation of performance.

The invention provides significant advantages over the prior art. Adding a digital signal processor to a computer system to enable enhanced functions is as easy as expanding the memory of a MPU. The memory module can use a form factor of the type standardized by organizations like IEEE, JEDEC, and so on, such as a SIMM (single in-line memory module) or DIMM (dual in-line memory module) form factor.

Different applications may be downloaded by the MPU to the memory module for local execution. The memory module therefore supports multiple functionality, i.e., downloadable, multiple functions under software control of the MPU.

The DSP/memory module offers the highest possible bandwidth between the MPU and coprocessor at any given time and technology. The DSP/memory module is both bus-independent, and host-independent, for use with PCs (personal computers), PDAs (personal digital assistants), workstations and other computer systems.

The DSP/memory module reduces system cost by sharing system memory over a number of multimedia functions.

The module provides a framework for easily scaling up the processing power of a computer system; an existing single processor system can be transformed into a scaleable, multiprocessing system simply by adding a memory module.

Users do not have to change their product platforms in order to get/offer new, value-added functions. Adding the DSP/memory module and software can allow users to increase the capability of their computers.

While the DSP/memory module 40 has been shown with a single DSP on each module, multiple DSPs could be provided. Additionally, a DSP/memory module 40 could be used in each memory bank 50 to provide multiple DSPs 54 under control of the MPU 12.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. A computer system comprising:
   system processing circuitry;
   a processor/memory module coupled to said system processing circuitry comprising:
      semiconductor memory;
      a processor coupled to said semiconductor memory; and
      control circuitry for providing communications between said system processing circuitry and said processor
   such that said system processing circuitry can access said semiconductor memory as main memory and can instruct said processor to transform data and store transformed data in said semiconductor memory for access by said system processing circuitry, said system processing circuitry determines whether a processor/memory module is installed in the system by successively writing signature data to a memory location for a predetermined number of times and reading the data stored in the location to see if it matches an expected response.

2. The computer system of claim 1 wherein said processor comprises a programmable general purpose processor.

3. The computer system of claim 1 wherein said processor comprises a digital signal processor.

4. The computer system of claim 1 wherein said processor/memory module further includes local memory coupled to said processor for storing data and instructions.

5. The computer system of claim 1 wherein said expected response is the complement of the signature data.

6. The computer system of claim 1 wherein said memory location is a current location and further comprising the step of reading a next location in memory if the data read from said current location does not match said expected response.

7. The computer system of claim 6 wherein said step of reading from said next location is repeated until there are no more locations to be read or said expected response is read.

8. The computer system of claim 1 wherein said processor/memory module has an associated address range for communicating with the system processing circuitry.

9. The computer system of claim 8 wherein said system processing circuitry can change said associated address range to a desired address range.

10. A computer comprising:
    system processing circuitry;
    a memory bus; and
    a processor/memory module coupled to said processing circuitry via said memory bus comprising:
    semiconductor memory;
    one or more processors coupled to said semiconductor memory; and
    control circuitry for providing communications between said system processing circuitry and said processor
    such that said system processing circuitry can access said semiconductor memory as main memory and can instruct said processor to transform data and store transformed data in said semiconductor memory for access by said system processing circuitry,
    said system processing circuitry determines whether a processor/memory module is installed in the system by successively writing signature data to a memory location for a predetermined number of times and reading the data stored in the location to see if it matches an expected response.

11. The computer system of claim 10 wherein said processor comprises a programmable general purpose processor.

12. The computer system of claim 10 wherein said processor comprises a digital signal processor.

13. The computer system of claim 10 wherein said processor/memory module further includes local memory coupled to said processor for storing data and instructions.

14. The computer system of claim 10 wherein said expected response is the complement of the signature data.

15. The computer system of claim 10 wherein said memory location is a current location and further comprising the step of reading a next location in memory if the data read from said current location does not match said expected response.

16. The computer system of claim 15 wherein said step of reading from said next location is repeated until there are no more locations to be read or said expected response is read.

17. The computer system of claim 10 wherein said processor/memory module has an associated address range for communicating with the system processing circuitry.

18. The computer system of claim 17 wherein said system processing circuitry can change said associated address range to a desired address range.

19. The computer system of claim 10 wherein said processor memory module further comprises circuitry for processing analog signals.

20. The computer system of claim 10 wherein said circuitry for processing analog signals comprises a CODEC.

21. The computer system of claim 20 and further comprising and analog front end for receiving said external analog signals and transmitting said external analog signals to said circuitry for processing analog signals.

22. The computer system of claim 10 wherein said computer system further comprises:
    a bus coupled to said system processing circuitry and having a connection to said memory bus which bypasses said system processing circuitry; and
    analog signal processing circuitry coupled said bus.

23. The computer system of claim 22 wherein said analog processing circuitry includes circuitry for polling said processor/memory module via said memory bus to determine when a task has been completed.

24. The computer system of claim 10 wherein said control circuitry further comprises a switch for switching access to said semiconductor memory from said one or more processors and said system processing circuitry.

25. The computer system of claim 10 wherein said semiconductor memory includes single ported memory and dual ported memory.

26. The computer system of claim 10 wherein said control circuitry includes circuitry for generating a signal to said system processing circuitry upon completion of a task by said one or more processors.

27. The computer system of claim 10 wherein said control circuitry further includes circuitry for generating a wait signal to said system processing circuitry when said one or more processors are accessing said semiconductor memory.

28. The computer system of claim 10 wherein said processor/memory module is formed on a SIMM.

29. The computer system of claim 10 wherein said processor/memory module is formed on a DIMM.

30. A method of processing data in a computer system, comprising the steps of:
    processing a first set of instructions using system processing circuitry;
    processing a second set of instructions using one or more processors coupled to said system processing circuitry via a memory bus; and
    sharing semiconductor memory on said memory bus between said processing circuitry and said processor;
    and determining whether a processor is coupled to the memory bus by successively writing signature data to a memory location for a predetermined number of times and reading the data stored in the location to see if it matches an expected response.

31. The method of claim 30 wherein said step of processing said second set of instructions comprises the step of processing said second set of instruction using one or more programmable general purpose processors.

32. The method of claim 30 wherein said step of processing said second set of instructions comprises the step of processing said second set of instruction using one or more programmable digital signal processors.

33. The method of claim 30 wherein said step of processing said second step of instructions includes the step of storing instructions in a local memory coupled to said one or more processors.

34. The method of claim 30 wherein said step of processing said second step of instructions includes the step of storing data in a local memory coupled to said one or more processors.

35. The method of claim 30 and further comprising the step of selectably assigning an address range for said processor.

36. The method of claim 30 and further comprising the step of processing analog signals with an analog signal processor coupled to said one or more processors.

37. The method of claim 30 and further comprising the step of processing analog signals with an analog signal processor coupled to a peripheral bus which may communicate with the memory bus without intervention of said system processing circuitry.

38. The method of claim 37 and further comprising the step of polling said one or more processors with said analog signal processor to determine whether a task has been completed.

39. The method of claim 30 wherein said system processing circuitry polls said one or more processors to determine whether a task has been completed.

40. The method of claim 30 wherein said one or more processors signal said system processing circuitry when a task is complete.

41. The method of claim 30 and further comprising the step of switching access to said semiconductor memory between said system processing circuitry and said one or more processors.

42. The method of claim 30 and further comprising the step of signaling said system processing circuitry when said one or more of said digital signal processors are accessing said semiconductor memory.

* * * * *